(12) United States Patent
Bauerschmidt et al.

(10) Patent No.: US 11,703,634 B2
(45) Date of Patent: *Jul. 18, 2023

(54) MOUNTED HOLLOW-CORE FIBER ARRANGEMENT

(71) Applicant: ASML NETHERLANDS B.V., Veldhoven (NL)

(72) Inventors: Sebastian Thomas Bauerschmidt, Wendelstein (DE); Patrick Sebastian Uebel, Marloffstein (DE); Peter Maximilian Götz, Bavaria (DE)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 17/836,537

(22) Filed: Jun. 9, 2022

(65) Prior Publication Data

US 2022/0317368 A1 Oct. 6, 2022

Related U.S. Application Data

(63) Continuation of application No. 16/903,530, filed on Jun. 17, 2020, now Pat. No. 11,385,402.

(30) Foreign Application Priority Data

Jun. 21, 2019 (EP) .................................... 19181578
Jul. 17, 2019 (EP) .................................... 19186702

(51) Int. Cl.
*G02B 6/02* (2006.01)
*G03F 7/20* (2006.01)
(Continued)

(52) U.S. Cl.
CPC ..... *G02B 6/02328* (2013.01); *G02B 6/02366* (2013.01); *G03F 7/70008* (2013.01); *G01B 11/25* (2013.01)

(58) Field of Classification Search
CPC .................. G02B 6/02328; G02B 6/02366
See application file for complete search history.

(56) References Cited

U.S. PATENT DOCUMENTS 6,952,253 B2   10/2005   Lof et al.
6,961,116 B2   11/2005   Den Boef et al.
(Continued)

FOREIGN PATENT DOCUMENTS

CN   101140174   3/2008
EP   1628164     2/2006
(Continued)

OTHER PUBLICATIONS

Tian, H. et al., "Birefringence and Confinement Loss Properties in Photonic Crystal Fibres Under Lateral Stress", IEEE Photonics Tehnology Letters, vol. 20, No. 22, 2008.
(Continued)

*Primary Examiner* — Tina M Wong
(74) *Attorney, Agent, or Firm* — Pillsbury Winthrop Shaw Pittman, LLP

(57) ABSTRACT

A mounted hollow-core fiber arrangement includes a hollow-core fiber having a microstructure, and a mount arrangement including a plurality of mounting contacts configured to apply a force to an outer layer of the hollow-core fiber. A portion of the hollow-core fiber is located in a receiving region of the mount arrangement. The plurality of mounting contacts are positioned around the receiving region. The mounting contacts are distributed around the receiving region, the distribution of the mounting contacts corresponding to a distribution of features of the microstructure of the hollow-core fiber. The mounted hollow core fiber can be used in a radiation source apparatus for providing broadband radiation.

20 Claims, 8 Drawing Sheets

(51) Int. Cl.
  *G01B 11/25* (2006.01)
  *G03F 7/00* (2006.01)

(56) References Cited

U.S. PATENT DOCUMENTS

| | | | |
|---|---|---|---|
| 7,265,364 | B2 | 9/2007 | Teunissen et al. |
| 7,646,471 | B2 | 1/2010 | Teunissen et al. |
| 9,160,137 | B1 | 10/2015 | Abdolvand et al. |
| 11,372,154 | B2 * | 6/2022 | Sabert .................... G02F 1/365 |
| 2004/0015085 | A1 | 1/2004 | Soh et al. |
| 2007/0013921 | A1 | 1/2007 | Pellemans et al. |
| 2007/0296960 | A1 | 12/2007 | Den Boef et al. |
| 2008/0198380 | A1 | 8/2008 | Straaijer et al. |
| 2009/0168062 | A1 | 7/2009 | Straaijer |
| 2010/0007863 | A1 | 1/2010 | Jordanoska |
| 2010/0233600 | A1 | 9/2010 | Den Boef et al. |
| 2010/0328655 | A1 | 12/2010 | Den Boef |
| 2011/0026032 | A1 | 2/2011 | Den Boef et al. |
| 2011/0032500 | A1 | 2/2011 | Straaijer |
| 2011/0102753 | A1 | 5/2011 | Van De Kerkhof et al. |
| 2011/0102793 | A1 | 5/2011 | Straaijer |
| 2011/0188020 | A1 | 8/2011 | Den Boef et al. |
| 2011/0208342 | A1 | 8/2011 | Den Boef et al. |
| 2011/0249244 | A1 | 10/2011 | Leewis et al. |
| 2011/0293222 | A1 | 12/2011 | Sumida |
| 2012/0044470 | A1 | 2/2012 | Smilde et al. |
| 2012/0044495 | A1 | 2/2012 | Straaijer |
| 2013/0070252 | A1 | 3/2013 | Feth |
| 2013/0162996 | A1 | 6/2013 | Straaijer et al. |
| 2013/0209046 | A1 * | 8/2013 | Tanigawa ........... G02B 6/02009 385/126 |
| 2013/0308142 | A1 | 11/2013 | Straaijer |
| 2015/0261097 | A1 | 9/2015 | Mathijssen et al. |
| 2016/0161863 | A1 | 6/2016 | Den Boef et al. |
| 2016/0370717 | A1 | 12/2016 | Den Boef et al. |
| 2017/0097464 | A1 | 4/2017 | Challener et al. |
| 2017/0123147 | A1 | 5/2017 | Brown et al. |
| 2017/0123162 | A1 | 5/2017 | Matsuda |
| 2018/0329148 | A1 * | 11/2018 | Matsuda .............. G02B 6/3858 |
| 2019/0011634 | A1 | 1/2019 | Lyngsøe et al. |
| 2020/0400880 | A1 | 12/2020 | Bauerschmidt |
| 2021/0124112 | A1 | 4/2021 | Uebel |

FOREIGN PATENT DOCUMENTS

| | | |
|---|---|---|
| EP | 3136143 | 3/2017 |
| JP | 2002277688 | 9/2002 |
| WO | 2011012624 | 2/2011 |
| WO | 2016102127 | 6/2016 |
| WO | 2017032454 | 3/2017 |
| WO | 2018127266 | 7/2018 |

OTHER PUBLICATIONS

European Office Action and Search Report dated Jan. 29, 2020 issued in corresponding European Patent Application No. 19186702.7.

Taiwanese Search Report issued in corresponding Taiwanese Patent Application No. 109120734, dated Jan. 19, 2021.

International Search Report and Written Opinion issued in corresponding PCT Patent Application No. PCT/EP2020/065890, dated Aug. 31, 2020.

* cited by examiner

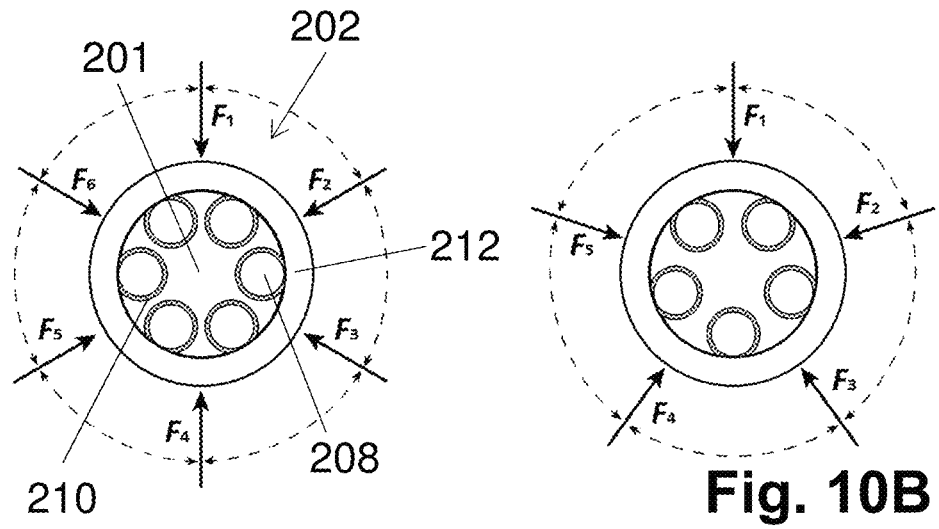
Fig. 10A
Fig. 10B
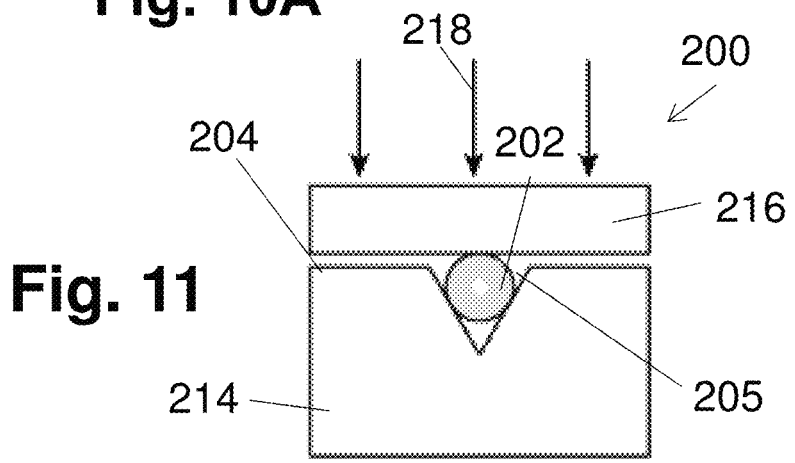
Fig. 11
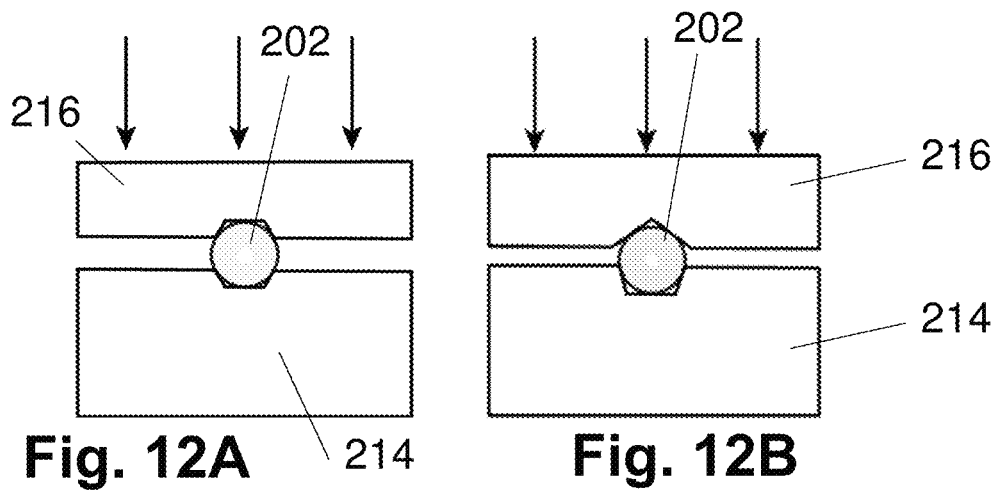
Fig. 12A
Fig. 12B

MOUNTED HOLLOW-CORE FIBER ARRANGEMENT

This application is a continuation of U.S. patent application Ser. No. 16/903,530, filed Jun. 17, 2020, which claims the benefit of priority of European patent application no. 19181578.6, filed Jun. 21, 2019, and of European patent application no. 19186702.7, filed Jul. 17, 2019, each of the foregoing applications is incorporated herein in its entirety by reference.

FIELD

The present description relates to mounted fiber arrangements for hollow-core fibers. Specifically, it relates to the distribution of forces applied by a mount to hollow-core fibers comprising internal microstructures.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") at a patterning device (e.g., a mask) onto a layer of radiation-sensitive material (resist) provided on a substrate (e.g., a wafer).

To project a pattern on a substrate a lithographic apparatus may use electromagnetic radiation. The wavelength of this radiation determines the minimum size of features which can be formed on the substrate. Typical wavelengths currently in use are 365 nm (i-line), 248 nm, 193 nm and 13.5 nm. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

Low-$k_1$ lithography may be used to process features with dimensions smaller than the classical resolution limit of a lithographic apparatus. In such process, the resolution formula may be expressed as $CD=k_1 \times \lambda/NA$, where $\lambda$ is the wavelength of radiation employed, NA is the numerical aperture of the projection optics in the lithographic apparatus, CD is the "critical dimension" (generally the smallest feature size printed, but in this case half-pitch) and $k_1$ is an empirical resolution factor. In general, the smaller $k_1$ the more difficult it becomes to reproduce the pattern on the substrate that resembles the shape and dimensions planned by a circuit designer in order to achieve particular electrical functionality and performance. To overcome these difficulties, sophisticated fine-tuning steps may be applied to the lithographic projection apparatus and/or design layout. These include, for example, but not limited to, optimization of NA, customized illumination schemes, use of phase shifting patterning devices, various optimization of the design layout such as optical proximity correction (OPC, sometimes also referred to as "optical and process correction") in the design layout, or other methods generally defined as "resolution enhancement techniques" (RET). Alternatively, tight control loops for controlling a stability of the lithographic apparatus may be used to improve reproduction of the pattern at low k1.

In relation to lithography applications, many different types of measurements may be performed, both within a lithographic apparatus and external to the lithographic apparatus. Generally, such measurements may be performed by apparatus using a radiation source to irradiate a measurement target, and a detection system operable to measure at least one property of a portion of the incident radiation scattered from the target. Examples of a measurement apparatus external to a lithographic apparatus include a metrology apparatus and an inspection apparatus. A metrology apparatus may return data relating to one or more properties of a substrate, wherein data may be quantitative data. An inspection apparatus may detect defects or imperfections on a substrate. Examples of measurement systems inside a lithographic apparatus include topography measurements, position measurements, and alignment measurements, for measuring properties of patterns on a substrate.

The quality of measurements may affect the quality of the lithographic process they are associated with. One of the elements that may affect the quality of the measurements is the quality of the radiation used in the measurements.

Different types of radiation may be used to interrogate different properties of a substrate.

SUMMARY

According to an aspect of the disclosure, there is provided a mounted hollow-core fiber arrangement comprising a hollow-core fiber having a microstructure, and a mount arrangement comprising a plurality of mounting contacts configured to apply a force to an outer layer of the hollow-core fiber. A portion of the hollow-core fiber is located in a receiving region of the mount arrangement. The plurality of mounting contacts are positioned around the receiving region. The mounting contacts are distributed around the receiving region, the distribution of the mounting contacts corresponding to a distribution of features of the microstructure of the hollow-core fiber.

Optionally, each of the plurality of mounting contacts may be configured to apply a substantially equal force to the outer layer of the hollow-core fiber.

Optionally, the positions of the plurality of mounting contacts may be equispaced around the receiving region.

Optionally, the distribution of features of the microstructure may comprise a symmetry. The positions of the plurality of mounting contacts may have a symmetry corresponding to the symmetry of the microstructure.

Optionally, the hollow-core fiber may be a hollow-core photonic crystal fiber comprising a single ring structure with a plurality of capillaries surrounding the hollow core.

Optionally, the capillaries distribution in the single ring structure may have a number of rotational symmetries. The number of mounting contacts may be an integer multiple of the number of rotational symmetries or the number of rotational symmetries may be an integer multiple of the number of mounting contacts.

Optionally, the number of mounting contacts may be equal to the number of capillaries surrounding the hollow core.

Optionally, the portion of the hollow-core fiber mounted inside the receiving region of the mount arrangement may be an end portion of the hollow-core fiber.

Optionally, the force applied by the mounting contacts may be adjustable.

Optionally, the mount arrangement may comprise a spring-loaded screw configured to adjust the force applied by the mounting contacts.

Optionally, the mount arrangement may comprise an electrical arrangement configured to adjust the force applied by the mounting contacts by applying an electric field.

Optionally, the electrical arrangement may comprise a first plate on a first side of the mount arrangement, and a second plate on a second side of the mount arrangement, wherein the receiving region is located between the first side and the second side. The force may be configured to be adjusted by adjusting an electric field applied between the first plate and the second plate.

Optionally, the mount arrangement may comprise a magnetic arrangement configured to adjust the force applied by the mounting contacts by applying a magnetic field.

Optionally, the magnetic arrangement may comprise a first magnet on a first side of the mount arrangement, and a second magnet of a second side of the mount arrangement, wherein the receiving region is located between the first side and the second side. The force may be configured to be adjusted by adjusting the magnetic field applied between the first magnet and the second magnet.

Optionally, the force may be configured to be adjusted to optimize performance of the hollow-core fiber for a predetermined narrow wavelength range.

Optionally, the predetermined narrow wavelength range may comprise a wavelength of a source for providing input radiation to be coupled into the hollow-core fiber.

Optionally, the predetermined wavelength range may comprise at least a portion of an operating wavelength range of the hollow-core fiber.

Optionally, the hollow-core fiber may be configured to operate over a broadband wavelength range.

Optionally, the broadband wavelength range may comprise wavelengths from 200 nm to 2000 nm.

Optionally, the broadband wavelength range may comprise wavelengths from 400 nm to 1000 nm.

Optionally, the mount arrangement may comprise a base with a groove forming part of the receiving region, and a top lid configured to cover the base.

Optionally, the top lid may comprise a groove for receiving the hollow-core fiber, wherein the top lid groove may align with the base groove to form the receiving region.

Optionally, the base groove and the top lid may be configured to form a polygonal form when the top lid covers the base.

Optionally, each side of the polygonal form may comprise a mounting contact.

Optionally, the polygonal form may a regular polygonal form.

Optionally, the mounted hollow-core fiber arrangement may further comprise a reservoir configured to provide a resealable airtight seal between an interior of the reservoir and an exterior of the reservoir. The mounted hollow-core fiber may be located inside the reservoir. The reservoir may be configured to contain a controlled gas mixture.

Optionally, the mounted hollow core fiber arrangement may comprise a second mount arrangement, wherein a second portion of the hollow-core fiber may be located inside a receiving region of the second mount arrangement.

According to an aspect of the current disclosure, there is provided a mounted hollow-core fiber arrangement, comprising a hollow-core fiber having a microstructure, and a mount arrangement comprising a plurality of mounting contacts configured to apply a force at a plurality of contact points to an outer layer of the hollow-core fiber. The hollow-core fiber may be located in a receiving region of the mount arrangement. The plurality of mounting contacts may be positioned uniformly around the receiving region of the mount arrangement. The plurality of mounting contacts may be configured to apply a substantially equal force at each of the plurality of contact points to the outer layer of the hollow-core fiber.

Optionally, the hollow core fiber may be a hollow core photonic crystal fiber comprising a single ring comprising a plurality of capillaries surrounding the hollow core.

According to an aspect of the current disclosure, there is provided a radiation source apparatus for providing output radiation. The radiation source apparatus may comprise a mounted hollow-core fiber arrangement as described herein. The hollow-core fiber may comprise an input end portion configured to receive input radiation, and an output end portion configured to provide output radiation. The output end portion of the hollow-core fiber may be located inside the receiving region of a first mount arrangement.

Optionally, the output radiation may be broadband output radiation. The hollow-core fiber may be configured to receive input radiation at the input end portion, broaden the wavelength range of the input radiation as the radiation propagates through the hollow-core fiber, and provide broadband output radiation at the output end portion of the hollow-core fiber.

Optionally, the input end portion of the hollow-core fiber may be located in a receiving region of a second mount arrangement configured to receive the input end portion of the hollow-core fiber. The second mount arrangement and the input end portion may be located inside the interior of the reservoir.

Optionally, the first mount arrangement may be configured to apply a first force to the output end portion and the second mount arrangement may be configured to apply a second force to the input end portion. The first force may be optimized to reduce stress-induced loss or mode scrambling in or for a narrow wavelength range comprising in the output radiation. The second force may be optimized to reduce stress-induced loss or mode scrambling in or for the input wavelength.

According to an aspect of the disclosure, there is provided a method of mounting a hollow-core fiber into a mount arrangement. The method may comprise providing a hollow-core fiber and a mount arrangement as described herein, mounting a portion of the hollow-core fiber in the mount arrangement, providing input radiation into the end section of the hollow-core fiber, measuring radiation output by the hollow-core fiber for determining stress-induced loss or mode scrambling, and adjusting, while measuring radiation output by the fiber, the force applied by the plurality of mounting contacts of the mount arrangement so that stress-induced loss or mode scrambling inside the hollow-core fiber is reduced.

According to an aspect of the disclosure, there is provided a metrology arrangement comprising a radiation source apparatus as described herein.

According to an aspect of the disclosure, there is provide a metrology apparatus comprising the metrology arrangement as described herein.

According to an aspect of the disclosure, there is provided an inspection apparatus comprising the metrology arrangement as described herein.

According to an aspect of the disclosure, there is provided a lithographic apparatus comprising the metrology arrangement as described herein.

BRIEF DESCRIPTION OF THE DRAWINGS

Embodiments of the invention will now be described, by way of example only, with reference to the accompanying schematic drawings, in which:

FIGS. 10A and 10B depict schematic representations of a hollow-core fiber held by a plurality of mounting contacts with a distribution corresponding to a distribution of the microstructure of the hollow-core fiber;

FIG. 11 depicts a schematic representation of a mounted hollow-core fiber arrangement;

FIGS. 12A and 12B depict schematic representations of mounted hollow-core fiber arrangements wherein the receiving regions have a regular polygon shape;

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
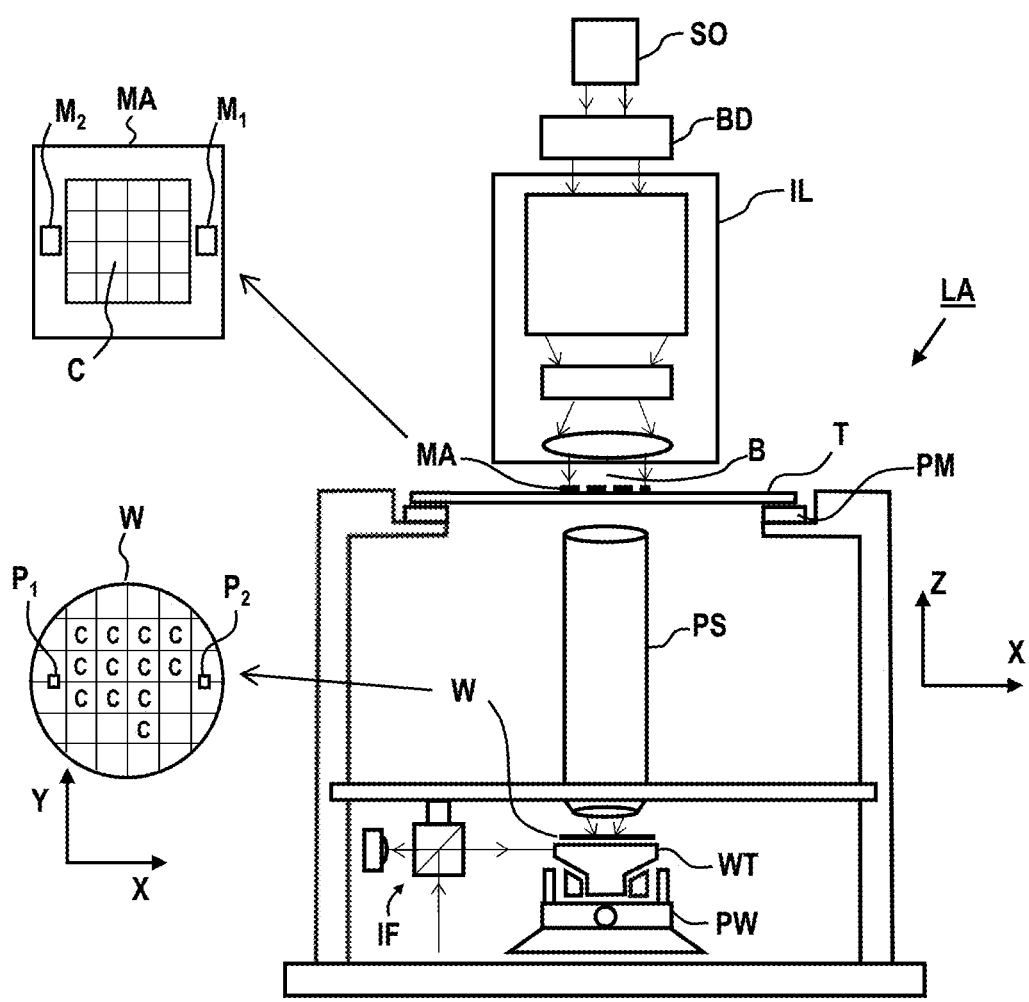
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) T constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein in its entirety by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support T, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

Figure 2:
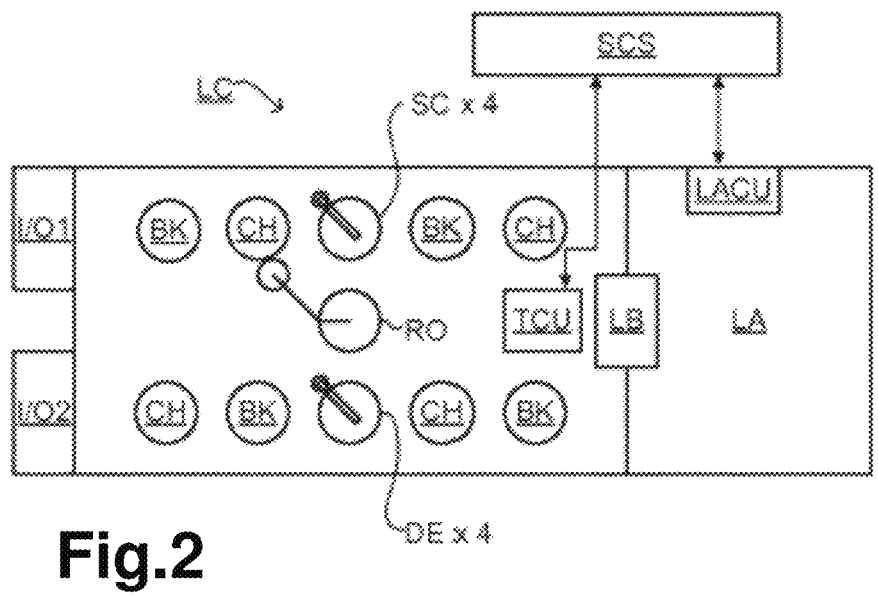
FIG. 2 depicts a schematic overview of a lithographic cell.

As shown in FIG. 2 the lithographic apparatus LA may form part of a lithographic cell LC, also sometimes referred to as a lithocell or (litho)cluster, which often also includes apparatus to perform pre- and post-exposure processes on a substrate W. Conventionally these include spin coaters SC to deposit resist layers, developers DE to develop exposed resist, chill plates CH and bake plates BK, e.g. for conditioning the temperature of substrates W e.g. for conditioning solvents in the resist layers. A substrate handler, or robot, RO picks up substrates W from input/output ports I/O1, I/O2, moves them between the different process apparatus and delivers the substrates W to the loading bay LB of the lithographic apparatus LA. The devices in the lithocell, which are often also collectively referred to as the track, are typically under the control of a track control unit TCU that in itself may be controlled by a supervisory control system SCS, which may also control the lithographic apparatus LA, e.g. via lithography control unit LACU.

In order for the substrates W exposed by the lithographic apparatus LA to be exposed correctly and consistently, it is desirable to inspect substrates to measure properties of patterned structures, such as overlay errors between subsequent layers, line thicknesses, critical dimensions (CD), etc. For this purpose, inspection tools (not shown) may be included in the lithocell LC. If errors are detected, adjustments, for example, may be made to exposures of subsequent substrates or to other processing steps that are to be performed on the substrates W, especially if the inspection is done before other substrates W of the same batch or lot are still to be exposed or processed.

An inspection apparatus, which may also be referred to as a metrology apparatus, is used to determine properties of the substrates W, and in particular, how properties of different substrates W vary or how properties associated with different layers of the same substrate W vary from layer to layer. The inspection apparatus may alternatively be constructed to identify defects on the substrate W and may, for example, be part of the lithocell LC, or may be integrated into the lithographic apparatus LA, or may even be a stand-alone device. The inspection apparatus may measure the properties on a latent image (image in a resist layer after the exposure), or on a semi-latent image (image in a resist layer after a post-exposure bake step PEB), or on a developed resist image (in which the exposed or unexposed parts of the resist have been removed), or even on an etched image (after a pattern transfer step such as etching).

Figure 3:
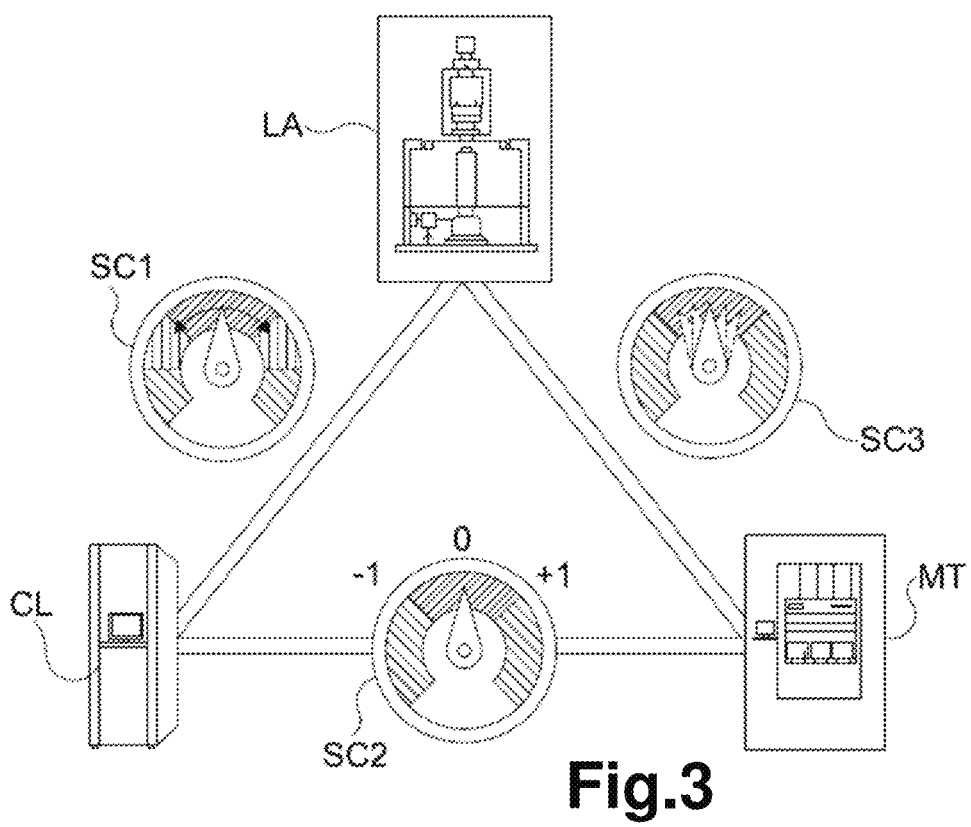
FIG. 3 depicts a schematic representation of holistic lithography, representing a cooperation between three key technologies to optimize semiconductor manufacturing.

Typically the patterning process in a lithographic apparatus LA is one of the most critical steps in the processing which requires high accuracy of dimensioning and placement of structures on the substrate W. To ensure this high accuracy, three systems may be combined in a so called "holistic" control environment as schematically depicted in FIG. 3. One of these systems is the lithographic apparatus LA which is (virtually) connected to a metrology tool MT (a second system) and to a computer system CL (a third system). The key of such "holistic" environment is to optimize the cooperation between these three systems to enhance the overall process window and provide tight control loops to ensure that the patterning performed by the lithographic apparatus LA stays within a process window. The process window defines a range of process parameters (e.g. dose, focus, overlay) within which a specific manufacturing process yields a defined result (e.g. a functional semiconductor device)—typically within which the process parameters in the lithographic process or patterning process are allowed to vary.

The computer system CL may use (part of) the design layout to be patterned to predict which resolution enhancement techniques to use and to perform computational lithography simulations and calculations to determine which mask layout and lithographic apparatus settings achieve the largest overall process window of the patterning process (depicted in FIG. 3 by the double arrow in the first scale SC1). Typically, the resolution enhancement techniques are arranged to match the patterning possibilities of the lithographic apparatus LA. The computer system CL may also be used to detect where within the process window the lithographic apparatus LA is currently operating (e.g. using input from the metrology tool MT) to predict whether defects may be present due to e.g. sub-optimal processing (depicted in FIG. 3 by the arrow pointing "0" in the second scale SC2).

The metrology tool MT may provide input to the computer system CL to enable accurate simulations and predictions, and may provide feedback to the lithographic apparatus LA to identify possible drifts, e.g. in a calibration status of the lithographic apparatus LA (depicted in FIG. 3 by the multiple arrows in the third scale SC3).

In lithographic processes, it is desirable to make frequently measurements of the structures created, e.g., for process control and verification. Tools to make such measurement are typically called metrology tools MT. Different types of metrology tools MT for making such measurements are known, including scanning electron microscopes or various forms of scatterometer metrology tools MT. Scatterometers are versatile instruments which allow measurements of the parameters of a lithographic process by having a sensor in the pupil or a conjugate plane with the pupil of the objective of the scatterometer, measurements usually referred as pupil based measurements, or by having the sensor in the image plane or a plane conjugate with the image plane, in which case the measurements are usually referred as image or field based measurements. Such scatterometers and the associated measurement techniques are further described in U.S. Patent Application Publication Nos. US20100328655, US2011102753A1, US20120044470A, US20110249244, and US20110026032 and in European Patent Application Publication No. EP1, 628,164, each incorporated herein in its entirety by reference. Aforementioned scatterometers may measure gratings using light from soft x-ray and visible to near-IR wavelength range.

In a first embodiment, the scatterometer MT is an angular resolved scatterometer. In such a scatterometer reconstruction methods may be applied to the measured signal to reconstruct or calculate properties of the grating. Such reconstruction may, for example, result from simulating interaction of scattered radiation with a mathematical model of the target structure and comparing the simulation results with those of a measurement. Parameters of the mathematical model are adjusted until the simulated interaction produces a diffraction pattern similar to that observed from the real target.

In a second embodiment, the scatterometer MT is a spectroscopic scatterometer MT. In such spectroscopic scatterometer MT, the radiation emitted by a radiation source is directed onto the target and the reflected or scattered radiation from the target is directed to a spectrometer detector, which measures a spectrum (i.e. a measurement of intensity as a function of wavelength) of the specular reflected radiation. From this data, the structure or profile of the target giving rise to the detected spectrum may be reconstructed, e.g. by Rigorous Coupled Wave Analysis and non-linear regression or by comparison with a library of simulated spectra.

In a third embodiment, the scatterometer MT is an ellipsometric scatterometer. The ellipsometric scatterometer allows for determining parameters of a lithographic process by measuring scattered radiation for each polarization states. Such metrology apparatus emits polarized light (such as linear, circular, or elliptic) by using, for example, appropriate polarization filters in the illumination section of the metrology apparatus. A source suitable for the metrology apparatus may provide polarized radiation as well. Various embodiments of existing ellipsometric scatterometers are described in U.S. Patent Application Publication Nos. US 2007-0296960, US 2008-0198380, US 2009-0168062, US 2010-0007863, US 2011-0032500, US 2011-0102793, US 2011-0188020, US 2012-0044495, US 2013-0162996 and US 2013-0308142, each of which is incorporated herein in its entirety by reference.

In one embodiment of the scatterometer MT, the scatterometer MT is adapted to measure the overlay of two misaligned gratings or periodic structures by measuring asymmetry in the reflected spectrum and/or the detection configuration, the asymmetry being related to the extent of the overlay. The two (typically overlapping) grating structures may be applied in two different layers (not necessarily consecutive layers), and may be formed substantially at the same position on the wafer. The scatterometer may have a symmetrical detection configuration as described e.g. in European Patent Application Publication No. EP1,628,164, which is incorporated herein in its entirety by reference, such that any asymmetry is clearly distinguishable. This provides a straightforward way to measure misalignment in gratings. Further examples for measuring overlay error between the two layers containing periodic structures as target is measured through asymmetry of the periodic structures may be found in PCT Patent Application Publication No. WO 2011/012624 or U.S. Patent Application Publication No. US 20160161863, each incorporated herein in its entirety by reference.

Other parameters of interest may be focus and dose. Focus and dose may be determined simultaneously by scatterometry (or alternatively by scanning electron microscopy) as described in U.S. Patent Application Publication No. US2011-0249244, incorporated herein in its entirety by reference. A single structure may be used which has a unique combination of critical dimension and sidewall angle measurements for each point in a focus energy matrix (FEM—also referred to as Focus Exposure Matrix). If these unique combinations of critical dimension and sidewall angle are available, the focus and dose values may be uniquely determined from these measurements.

A metrology target may be an ensemble of composite gratings, formed by a lithographic process, mostly in resist, but also after etch process for example. Typically the pitch and line-width of the structures in the gratings strongly depend on the measurement optics (in particular the NA of the optics) to be able to capture diffraction orders coming from the metrology targets. As indicated earlier, the diffracted signal may be used to determine shifts between two layers (also referred to 'overlay') or may be used to reconstruct at least part of the original grating as produced by the lithographic process. This reconstruction may be used to provide guidance of the quality of the lithographic process and may be used to control at least part of the lithographic process. Targets may have smaller sub-segmentation which are configured to mimic dimensions of the functional part of the design layout in a target. Due to this sub-segmentation, the targets will behave more similar to the functional part of the design layout such that the overall process parameter measurements resembles the functional part of the design layout better. The targets may be measured in an underfilled mode or in an overfilled mode. In the underfilled mode, the measurement beam generates a spot that is smaller than the overall target. In the overfilled mode, the measurement beam generates a spot that is larger than the overall target. In such overfilled mode, it may also be possible to measure different targets simultaneously, thus determining different processing parameters at the same time.

Overall measurement quality of a lithographic parameter using a specific target is at least partially determined by the measurement recipe used to measure this lithographic parameter. The term "substrate measurement recipe" may include one or more parameters of the measurement itself, one or more parameters of the one or more patterns measured, or both. For example, if the measurement used in a substrate measurement recipe is a diffraction-based optical measurement, one or more of the parameters of the measurement may include the wavelength of the radiation, the polarization of the radiation, the incident angle of radiation relative to the substrate, the orientation of radiation relative to a pattern on the substrate, etc. One of the criteria to select a measurement recipe may, for example, be a sensitivity of one of the measurement parameters to processing variations. More examples are described in U.S. Patent Application Publication No. US2016-0161863 and U.S. Patent Application Publication No. US 2016/0370717, each incorporated herein in its entirety by reference.

A topography measurement system, level sensor or height sensor, and which may be integrated in the lithographic apparatus, is arranged to measure a topography of a top surface of a substrate (or wafer). A map of the topography of the substrate, also referred to as height map, may be generated from these measurements indicating a height of the substrate as a function of the position on the substrate. This height map may subsequently be used to correct the position of the substrate during transfer of the pattern on the substrate, in order to provide an aerial image of the patterning device in a properly focus position on the substrate. It will be understood that "height" in this context refers to a dimension broadly out of the plane to the substrate (also referred to as Z-axis). Typically, the level or height sensor performs measurements at a fixed location (relative to its own optical system) and a relative movement between the substrate and the optical system of the level or height sensor results in height measurements at locations across the substrate.

Figure 4:
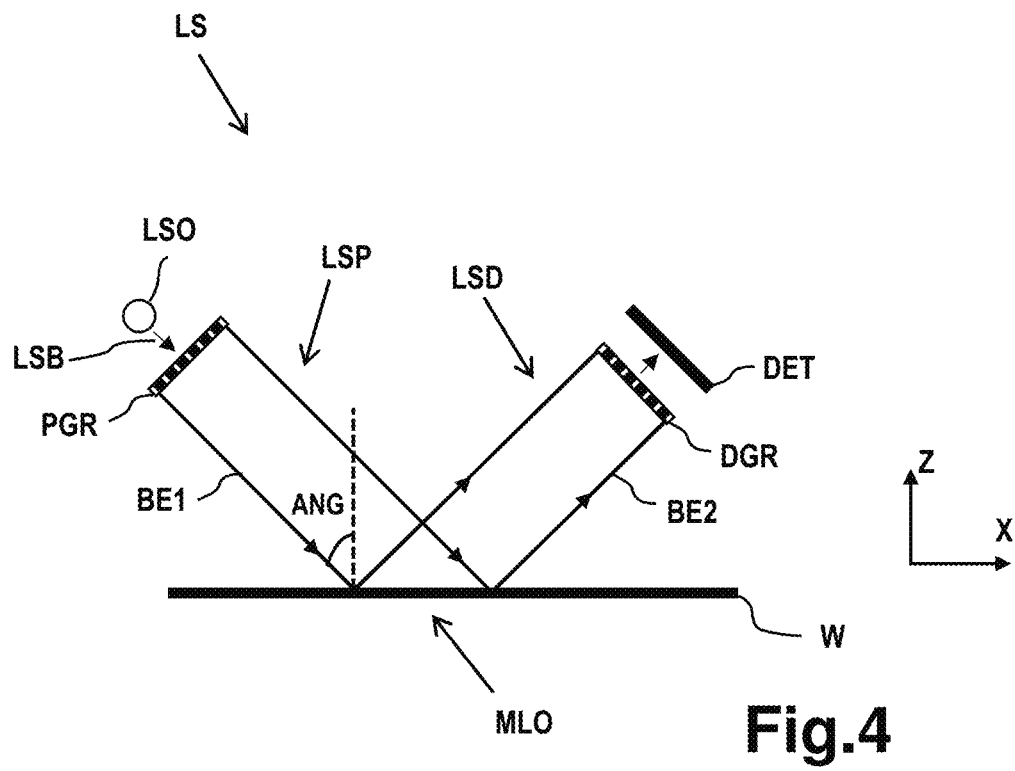
FIG. 4 depicts a schematic overview of a level sensor.

An example of a level or height sensor LS as known in the art is schematically shown in FIG. 4, which illustrates only the principles of operation. In this example, the level sensor comprises an optical system, which includes a projection unit LSP and a detection unit LSD. The projection unit LSP comprises a radiation source LSO providing a beam of radiation LSB which is imparted by a projection grating PGR of the projection unit LSP. The radiation source LSO may be, for example, a narrowband or broadband radiation source, such as a supercontinuum light source, polarized or non-polarized, pulsed or continuous, such as a polarized or non-polarized laser beam. The radiation source LSO may include a plurality of radiation sources having different colors, or wavelength ranges, such as a plurality of LEDs. The radiation source LSO of the level sensor LS is not restricted to visible radiation, but may additionally or alternatively encompass UV and/or IR radiation and any range of wavelengths suitable to reflect from a surface of a substrate.

The projection grating PGR is a periodic grating comprising a periodic structure resulting in a beam of radiation BE1 having a periodically varying intensity. The beam of radiation BE1 with the periodically varying intensity is directed towards a measurement location MLO on a substrate W having an angle of incidence ANG with respect to an axis perpendicular (Z-axis) to the incident substrate surface between 0 degrees and 90 degrees, typically between 70 degrees and 80 degrees. At the measurement location MLO, the patterned beam of radiation BE1 is reflected by the substrate W (indicated by arrows BE2) and directed towards the detection unit LSD.

In order to determine the height level at the measurement location MLO, the level sensor further comprises a detection system comprising a detection grating DGR, a detector DET and a processing unit (not shown) for processing an output signal of the detector DET. The detection grating DGR may be identical to the projection grating PGR. The detector DET produces a detector output signal indicative of the light received, for example indicative of the intensity of the light received, such as a photodetector, or representative of a spatial distribution of the intensity received, such as a camera. The detector DET may comprise any combination of one or more detector types.

By means of triangulation techniques, the height level at the measurement location MLO can be determined. The detected height level is typically related to the signal strength as measured by the detector DET, the signal strength having a periodicity that depends, amongst others, on the design of the projection grating PGR and the (oblique) angle of incidence ANG.

The projection unit LSP and/or the detection unit LSD may include further optical elements, such as lenses and/or mirrors, along the path of the patterned beam of radiation between the projection grating PGR and the detection grating DGR (not shown).

In an embodiment, the detection grating DGR may be omitted, and the detector DET may be placed at the position where the detection grating DGR is located. Such a configuration provides a more direct detection of the image of the projection grating PGR.

In order to cover the surface of the substrate W effectively, a level sensor LS may be configured to project an array of measurement beams BE1 onto the surface of the substrate W, thereby generating an array of measurement areas MLO or spots covering a larger measurement range.

Various height sensors of a general type are disclosed for example in United States Patent Nos. U.S. Pat. Nos. 7,265,364 and 7,646,471, each of which is incorporated in its entirety by reference. A height sensor using UV radiation instead of visible or infrared radiation is disclosed in United States Patent Application Publication No. US2010233600, which is incorporated herein in its entirety by reference. In PCT Patent Application Publication No. WO2016102127, which is incorporated herein in its entirety by reference, a compact height sensor is described which uses a multi-element detector to detect and recognize the position of a grating image, without needing a detection grating.

In the manufacture of complex devices, typically many lithographic patterning steps are performed, thereby forming functional features in successive layers on the substrate. A critical aspect of performance of the lithographic apparatus is therefore the ability to place the applied pattern correctly and accurately in relation to features laid down in previous layers (by the same apparatus or a different lithographic apparatus). For this purpose, the substrate is provided with one or more sets of marks. Each mark is a structure whose position can be measured at a later time using a position sensor, typically an optical position sensor. The position sensor may be referred to as "alignment sensor" and marks may be referred to as "alignment marks".

A lithographic apparatus may include one or more (e.g. a plurality of) alignment sensors by which positions of alignment marks provided on a substrate can be measured accurately. Alignment (or position) sensors may use optical phenomena such as diffraction and interference to obtain position information from alignment marks formed on the substrate. An example of an alignment sensor used in current lithographic apparatus is based on a self-referencing interferometer as described in U.S. Pat. No. 6,961,116, which is incorporated herein in its entirety by reference. Various enhancements and modifications of the position sensor have been developed, for example as disclosed in U.S. Patent Application Publication No. US2015261097, which is incorporated herein in its entirety by reference.

Figure 5:
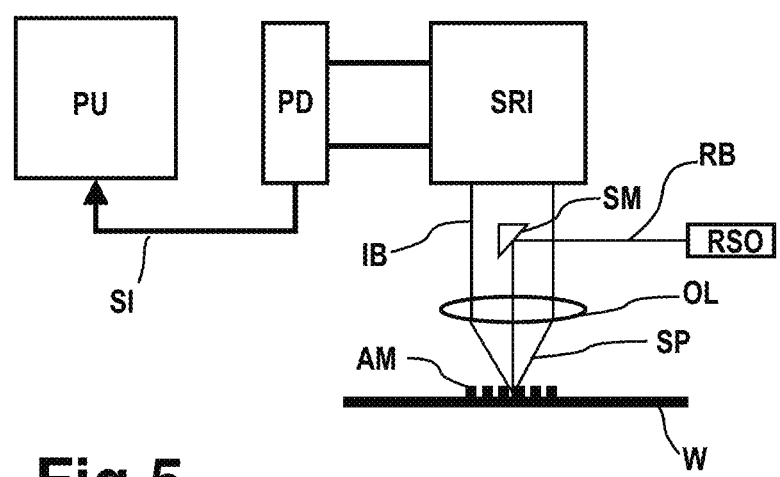
FIG. 5 depicts a schematic overview of an alignment sensor.

FIG. 5 is a schematic block diagram of an embodiment of a known alignment sensor AS, such as is described, for example, in U.S. Pat. No. 6,961,116, which is incorporated herein in its entirety by reference. Radiation source RSO provides a beam RB of radiation of one or more wavelengths, which is diverted by diverting optics onto a mark, such as mark AM located on substrate W, as an illumination spot SP. In this example the diverting optics comprises a spot mirror SM and an objective lens OL. The illumination spot SP, by which the mark AM is illuminated, may be slightly smaller in diameter than the width of the mark itself.

Radiation diffracted by the mark AM is collimated (in this example via the objective lens OL) into an information-carrying beam IB. The term "diffracted" is intended to include zero-order diffraction from the mark (which may be referred to as reflection). A self-referencing interferometer SRI, e.g. of the type disclosed in U.S. Pat. No. 6,961,116 mentioned above, interferes the beam IB with itself after which the beam is received by a photodetector PD. Additional optics (not shown) may be included to provide separate beams in case more than one wavelength is created by the radiation source RSO. The photodetector may be a single element, or it may comprise a number of pixels, if desired. The photodetector may comprise a sensor array.

The diverting optics, which in this example comprises the spot mirror SM, may also serve to block zero order radiation reflected from the mark, so that the information-carrying beam IB comprises only higher order diffracted radiation from the mark AM (this is not essential to the measurement, but improves signal to noise ratios).

Intensity signals SI are supplied to a processing unit PU. By a combination of optical processing in the block SRI and computational processing in the unit PU, values for X- and Y-position on the substrate relative to a reference frame are output.

A single measurement of the type illustrated only fixes the position of the mark within a certain range corresponding to one pitch of the mark. Coarser measurement techniques are used in conjunction with this to identify which period of a sine wave is the one containing the marked position. The same process at coarser and/or finer levels may be repeated at different wavelengths for increased accuracy and/or for robust detection of the mark irrespective of the materials from which the mark is made, and materials on and/or below which the mark is provided. The wavelengths may be multiplexed and de-multiplexed optically so as to be processed simultaneously, and/or they may be multiplexed by time division or frequency division.

In this example, the alignment sensor and spot SP remain stationary, while it is the substrate W that moves. The alignment sensor can thus be mounted rigidly and accurately to a reference frame, while effectively scanning the mark AM in a direction opposite to the direction of movement of substrate W. The substrate W is controlled in this movement by its mounting on a substrate support and a substrate positioning system controlling the movement of the substrate support. A substrate support position sensor (e.g. an interferometer) measures the position of the substrate support (not shown). In an embodiment, one or more (alignment) marks are provided on the substrate support. A measurement of the position of the marks provided on the substrate support allows the position of the substrate support as determined by the position sensor to be calibrated (e.g. relative to a frame to which the alignment system is connected). A measurement of the position of the alignment marks provided on the substrate allows the position of the substrate relative to the substrate support to be determined.

Metrology tools MT, such as a scatterometer, position measurement system, or topography measurement system mentioned above may use radiation origination from a radiation source to perform a measurement. The properties of the radiation used by a metrology tool MT may affect the type and quality of measurements that may be performed. The frequency of radiation used for a measurement may affect the size of features that may be interrogated by that radiation, and may affect the manner in which different materials interact with the radiation. For some applications, it may be advantageous to use multiple radiation frequencies to measure a substrate. For example, broadband radiation may be used, which may be supercontinuum radiation. Multiple different frequencies may be able to propagate, irradiate, and/or scatter off a metrology target with no or minimal interference with other frequencies. Therefore, different frequencies may, for example be used to obtain more and more diverse metrology data simultaneously. Different radiation frequencies may also be able to interrogate and discover different properties of a metrology target. Broadband radiation may also be useful in metrology tools MT such as level sensors, alignment mark measurement systems, scatterometry tools, or inspection tools. A broadband radiation source may be a supercontinuum source. In some instances, broadband output radiation may be filtered selectively to substantially remove one or more frequencies and/or frequency bands from the output radiation. This may be done, for example, to obtain filtered output radiation comprising one or more narrowband radiation regions of interest. The selective filtering may provide a tunable radiation source. The radiation may be electromagnetic radiation.

High quality broadband radiation may be difficult to generate. One option for generating broadband radiation such as broadband electromagnetic radiation is to use non-linear frequency broadening effects. In order to obtain significant non-linear effects high radiation intensities may be required. High intensity radiation may be achieved in an optical fiber. An optical fiber may have an elongate dimension comprising an optical axis along which the cross-section may be substantially constant. Radiation may be coupled into the fiber. Radiation may propagate through the fiber along the elongate dimension. Radiation may be confined inside a small space inside the fiber, for example mainly inside a core of the fiber. Due to its ability to confine radiation into a small area, fibers may be suitable for creating high radiation intensities localized inside a portion of the fiber. However, high radiation intensities may cause damage to the fiber material and/or the fiber structure. Damage to a fiber may lead to degradation of the optical performance of the fiber which may lead to a reduced lifetime of the fiber.

In order to address challenges of radiation-induced damage, a hollow-core fiber may be used for generating broadband radiation. Hollow-core fibers may be designed so that a majority of radiation coupled into the fiber is confined inside the hollow core. As a result, the interaction of the radiation with the fiber material is reduced, which may lead to a reduction of damage to the fiber material.

Microstructures may be included in a hollow-core fiber, for example surrounding the hollow core of the fiber. Microstructures may control and optimize radiation confinement and guidance properties inside the fiber. The microstructures may form a photonic crystal structure to create a photonic crystal fiber. For example, the microstructure may comprise a plurality of thin-walled features, such as periodic lattices or capillaries for controlling confinement and guiding properties of radiation inside the hollow core. A thin-walled feature may have wall thicknesses for example in a range between 100 nm and 1000 nm, between 500 nm-1000 nm, between 100 nm and 500 nm. Specifically, thin-walled features may have a wall thickness between 100 nm and 300 nm.

A hollow-core photonic crystal fiber (HC-PCF) may confine radiation predominantly inside a hollow core. A HC-PCF may guide the radiation as transverse modes along a fiber axis, which may be located in a central region along the elongate dimension of the fiber. The hollow core may be filled with a gas mixture, which, when interacting with high intensity radiation coupled into the fiber, experience non-linear broadening effects to generate broadband output radiation.

One example microstructure comprises a single ring structure in which a hollow core is surrounded by a single ring of capillaries. A capillary may be a thin-walled tube parallel to the optical axis of the fiber. The thin walls of the capillaries may cause interference effects that may be used to control mode confinement inside the fiber creating a photonic crystal fiber.

Guidance of radiation inside a hollow-core fiber may be sensitive to variations in the internal microstructure of the fiber. Unwanted or unintended variations of the radiation confinement and guidance in a hollow-core fiber may negatively affect one or more properties of output radiation. Changes in radiation confinement and guidance may do one or more selected from: damage the fiber, reduce the performance of the fiber, and/or decrease the lifetime of the fiber. One type of feature that may affect radiation behavior inside a fiber is a force applied to the fiber. Forces applied to a fiber may introduce stresses into the fiber. Stresses inside the fiber, for example in microstructures, may in turn lead to increased sensitivity to damage, and/or change radiation confinement inside the fiber. One example in which forces may be applied to a fiber, is where a fiber is mounted into a mount arrangement. The mount arrangement may apply a clamping force to hold the fiber in a desired location. The desired location may for example relate to a coupling element for coupling radiation into and/or out of the fiber. A mount arrangement may be in physical contact with a portion of the fiber, for example for controlling the position of that portion of the fiber. A mount arrangement may for example be used to facilitate efficient coupling of radiation in to and/or out of the fiber. Therefore, a mount arrangement may be found on one or both ends of a fiber.

Forces applied by a mount arrangement to a fiber may introduce stresses in the fiber material, which may affect fiber performance. A greater applied force may introduce a greater stress, and may have a greater negative effect on the fiber performance. Next to the size of the force, a hollow-core fiber may be sensitive to the distribution of the force. Specifically, asymmetric stress introduced in the fiber may have a negative effect on the fiber performance. Asymmetric stresses may be introduced by a non-symmetric mount arrangement, for example an arrangement using ferrules or adhesives to position a fiber. Asymmetric forces may also be applied by a mount arrangement where a fiber is locally contacted by sharp edges and/or kinks. Asymmetric stress distributions may result in one or more selected from: a decrease of optical transmission through a fiber, mode scrambling of guided modes in the fiber, increased damage of the fiber and/or decreased lifetime of the fiber. The effects of mode scrambling may be stronger for higher radiation frequencies. It is therefore desirable to obtain a symmetric stress distribution in order to reduce negative effects of the mount arrangement on a hollow-core fiber.

Figure 6:
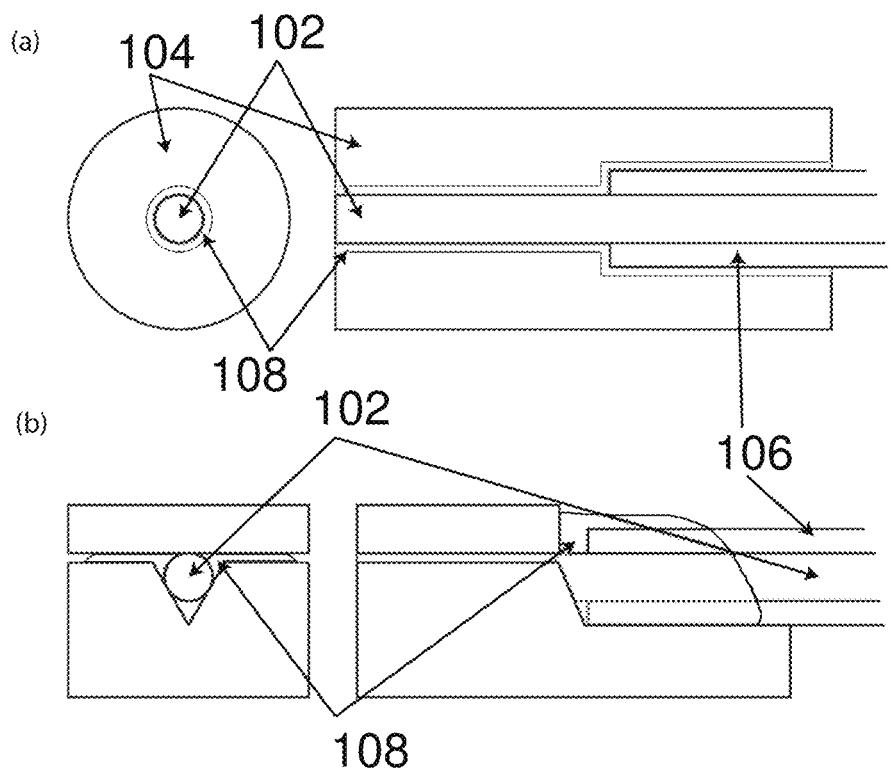
FIG. 6 depicts a setup of a fiber mounted in a mount arrangement.
Figure 7:
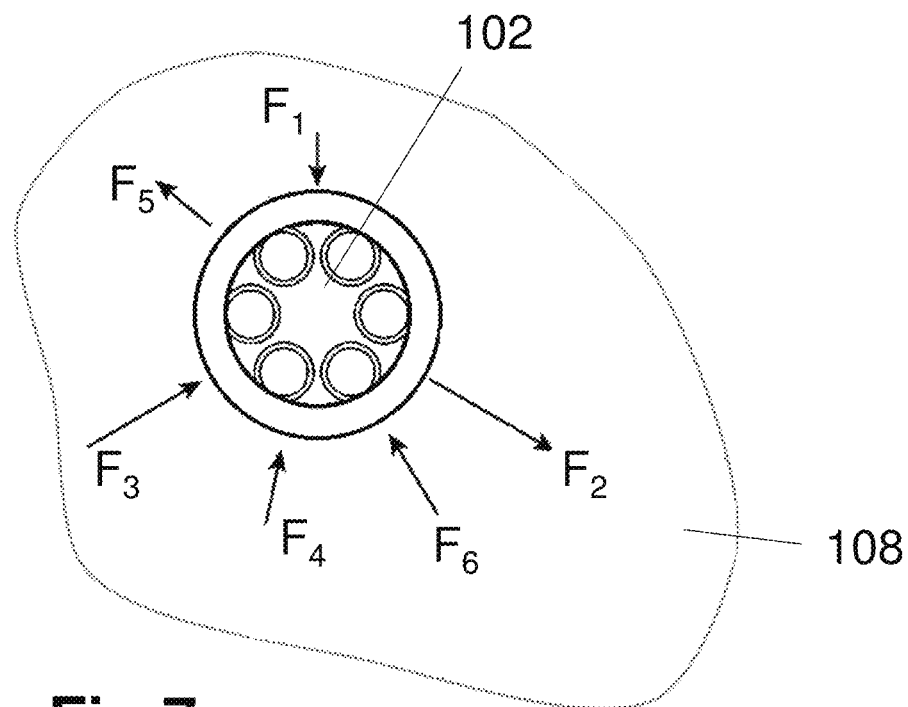
FIG. 7 depicts unevenly distributed forces applied to a hollow-core fiber by an adhesive.

FIG. 6 depicts an example setup of a fiber 102 located in a mount arrangement 104. The illustrated fiber has a protective coating 106 applied around an outer layer of the fiber. The coating 106 may be stripped from a first portion of the fiber located in the mount arrangement, for example to enable better coupling of radiation into the fiber. A second portion of the mount arrangement has retained the polymer coating 106. An adhesive 108 has been inserted in the area where the fiber 102 is received by the mount arrangement to attach the fiber and fix it in position in the mount arrangement 104. The adhesive 108 may apply an asymmetric force distribution to the fiber 102. An example asymmetric force distribution is illustrated in FIG. 7 depicting forces $F_1$ to $F_6$ applied to fiber 102 (e.g., hollow-core fiber). The forces $F_1$ to $F_6$ are shown to be applied by adhesive 108. The forces $F_1$ to $F_6$ have an uneven distribution around the fiber 102, and are not equal in size, leading to an overall asymmetry in the overall force applied to fiber 102.

Figure 8:
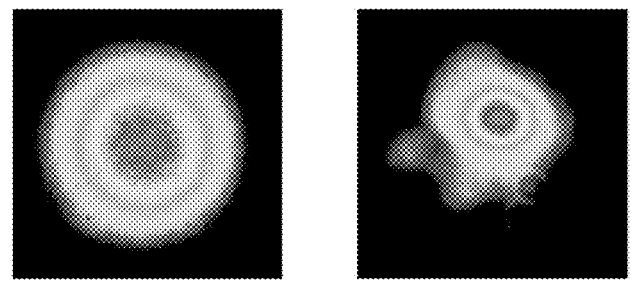
FIG. 8 depicts example beam profiles of hollow-core fibers for an even force distribution (left) and an uneven force distribution (right)

An example of the effects of uneven force distribution is illustrated in FIG. 8, which depicts example beam profiles for two different force distributions. The left image shows a beam profile of collimated output radiation of a fiber for a mount arrangement with an evenly distributed force applied to the fiber. The right image shows a beam profile of a collimated output radiation of a fiber for a mount arrangement applying an uneven force distribution.

In order to even out a force application around a fiber 102, a protective coating 106 may be applied around an outer layer of the hollow-core fiber. The protective coating 106 may for example be a polymer coating. However, in some instances the use of a polymer or other material coating is not suitable for an application. For example, organic components in an adhesive, polymer, or other material may outgas when the fiber 102 is in use. This may cause gaseous residuals being released into the immediate surroundings of the fiber. The gaseous residuals may be irradiated, which may lead to impurities being added inside the materials surrounding the core of the fiber 102. These impurities may be located on or near an internal surface of the fiber material and may lower the damage threshold of the fiber.

Described herein are methods and apparatus for mounting a fiber with an even force distribution for reducing stress-induced loss and/or mode scrambling inside a fiber, such as a hollow-core fiber. To mitigate potential negative outgassing effects described above, an embodiment of the methods and apparatuses are configured to be usable on a naked fiber, that is to say, a fiber without a protective coating 106. The presence of a microstructure inside the fiber may affect the reaction of the fiber to the force distribution. Therefore, the suggestion is to provide a force distribution that matches a distribution of elements in the microstructure.

Figure 9:
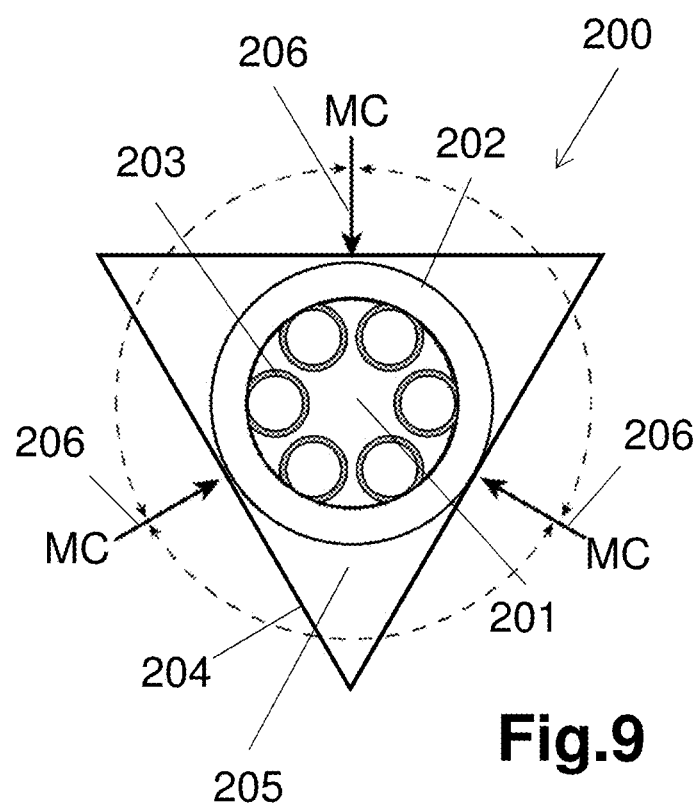
FIG. 9 depicts a schematic representation of a mounted hollow-core fiber arrangement comprising a hollow-core fiber with a microstructure surrounding the hollow core.

FIG. 9 depicts a schematic of a mounted hollow-core fiber arrangement 200, comprising a hollow-core fiber 202 with a microstructure 203 surrounding hollow core 201 of the fiber 202. A hollow-core fiber 202 may throughout the text be referred to as a fiber 202, for brevity. A portion of the hollow-core fiber 202 is located in a receiving region 205 of a mount arrangement 204 having a plurality of mounting contacts MC. The receiving region is a region around the fiber, where the fiber going to be placed. Optionally, a cross-section of the receiving region is in one plane perpendicular to fiber direction. The mounting contacts MC are in the receiving region and are distributed around the receiving region. The mounting contacts MC may be configured to apply a force 206 to an outer layer of the hollow-core fiber 202. The mounting contacts MC are positioned around the receiving portion 205 of the mount arrangement 204, so that they may contact the fiber 202. The mounting contacts MC may be distributed around the receiving region 205, wherein the distribution may be designed to correspond to a distribution of features of the microstructure 203 of the fiber 202.

When the distribution of the mounting contacts MC is designed to correspond to the distribution of the microstructures of the fiber, it means that the locations of the contact points between the mounting contacts and the outer layer of the hollow-core fiber are based on the locations of the microstructures of the fiber. In one embodiment, at least one of the contact points is positioned aligned with a position of one of the capillaries, which means that seen in a radial direction from a central portion (e.g., center) of the fiber, a line from the central portion to the contact point substantially coincides with a line from the central portion to the capillary. In another embodiment, at least one of the contact points is positioned in between, optionally, centered between two capillaries of the single ring structure, which means that seen in a radial direction from the central portion of the fiber, a line from the central portion to the contact point is substantially in between, optionally, substantially centered between two lines from the central portions (e.g., centers) of the two capillaries.

Optionally, all of the contact points are positioned aligned with positions of at least part of the capillaries or in or near the center between two capillaries of the single ring structure.

Optionally, the distribution of the mounting contacts has a symmetry corresponding to the distribution of the microstructures of the fiber. This means that the distribution of the mounting contacts has a symmetry based on at least one symmetry of the microstructure. In one example, the microstructure comprises both a 60 degrees rotational symmetry and a 120 degrees rotational symmetry, and the mounting contacts MD may comprise 60 degrees rotational symmetry or 120 degrees rotational symmetry.

Optionally, the symmetry is a reflectional symmetry. Optionally, the symmetry is a rotational symmetry.

Optionally, the number of mounting contacts is an integer multiple of the number of rotational symmetries or the number of rotational symmetries is an integer multiple of the number of mounting contacts. Note that the integer multiple herein means one of one time, two times, three times, four times, five times, etc.

The performance of the optical fiber 202 may be improved by having the distribution of the mounting contacts MC match a distribution of features of the microstructure 203. Such a correspondence may lead to a correspondence between the location of the force 206 application and the resulting stress introduced into the fiber 202. The stress distribution in the fiber may then have a correspondence to the features of the microstructure, meaning that a more even distribution of stress may be achieved, compared to situations where the mounting contacts MC are not made to correspond to the microstructure 203 feature distribution. An advantage of the corresponding distributions of mounting contacts MC and microstructure features 203 may therefore be a reduction in stress-induced loss and/or mode scrambling inside the hollow-core fiber 202. Loss may be loss of optical output power from the fiber 202 in a portion or the whole of the output frequency range. Mode scrambling may lead to a reduction in the quality of the shape and/or power distribution of the output radiation of the fiber 202. This in turn may lead to reduced performance of the mounted hollow-core fiber arrangement 200, for example when used in metrology applications.

Each of the plurality of mounting contacts MC may apply a substantially equal force to the outer layer of the hollow-core fiber 202. The three arrows indicating application of force 206 are shown to have the same size, indicating they apply a force 206 with the substantially the same size (e.g., within 90 and 110% of each other).

The positions of the mounting contacts MC may be essentially equispaced around the receiving region 205. This is illustrated in FIG. 9, in which three mounting contacts MC apply a force 206 spaced about 120 degrees apart around the periphery of the fiber 202 located in the mount arrangement 204. Equispacing of the mounting contacts CM may reflect a corresponding equispacing of features of the microstructure. For example, N essentially equispaced mounting contacts may correspond to an essentially equispaced distribution of N features. A feature may comprise a single element that is repeated, or a cluster of elements, wherein the cluster is repeated. In another example, N equispaced mounting contacts CM may correspond to 2N equispaced features of microstructure 203. This is illustrated in FIG. 9, where three mounting contacts CM are applying force 206 to a fiber 202 with six microstructure features 203.

In one example a hollow-core fiber 202 comprising a microstructure is provided inside a receiving region of a mount arrangement 204 to form a mounted hollow-core fiber arrangement 200. The mount arrangement may have a plurality of mounting contacts configured to apply a force to an outer layer of the hollow-core fiber 202 at a plurality of contact points. The plurality of mounting contacts may be positioned essentially uniformly around the receiving region of the mount arrangement. The plurality of mounting contacts MC may be configured to apply a substantially equal force at each of the plurality of contact points to the outer layer of the hollow-core fiber 202.

The distribution of features of microstructure 203 may comprise one or more symmetries. The positions of the mounting contacts CM may have a symmetry corresponding to at least one of the one or more symmetries of the microstructure 203. The microstructure 203 depicted in FIG. 9 comprises an essentially 120 degrees rotational symmetry, and the mounting contacts MD of FIG. 9 also comprise an essentially 120 degrees rotational symmetry. Note that the microstructure 203 depicted in FIG. 9 also comprises an essentially 60 degrees rotational symmetry.

The microstructure of hollow-core fiber 202 may comprise a photonic crystal structure. The fiber 202 may be a hollow-core photonic crystal fiber (HC-PCF). The microstructure 203 may comprise a single ring structure 203. The single ring may have a plurality of capillaries surrounding the hollow core 201. FIGS. 10A and 10B depict example hollow-core fibers 202 comprising a single ring structure 208 having a number of capillaries 210. Surrounding the single ring structure 208 there may be a cladding material 212, which may be a bulk material, for example a glass material.

The distribution of capillaries 210 around the hollow core 201 may have a number of rotational symmetries. In case the capillaries are essentially equispaced around the hollow core, the number of rotational symmetries may be equal to the number of capillaries. FIG. 10A depicts a hollow-core fiber 202 with 6 essentially equispaced capillaries 210 surrounding the hollow core 201. The equispacing may place the capillaries at about 60 degree intervals. The mounting contacts MC apply forces 206 at six similarly substantially equispaced positions. FIG. 10B depicts a hollow-core fiber 202 with 5 essentially equispaced capillaries 210 surrounding the hollow core 201. The equispacing may place the capillaries at about 72 degree intervals.

In some implementations, the position of the features of the microstructure 203 may be aligned to the positions of the mounting contacts MC of the mount arrangement. For example, in FIG. 10, the mounting contacts MC are depicted as being aligned to be positioned in about the center between two capillaries 210 of the single ring structure 208. Another example arrangement may be to align the positions of the capillaries 210 with the positions of the mounting contacts MC. This may be optimized in order to obtain a further reduction of stress-induced loss or mode scrambling in the hollow-core fiber 202. However, the alignment of microstructures 203 to the position of the mounting contacts MC is not required. The presence of corresponding distributions of the features of the microstructure 203 compared to the mounting contacts MC may be sufficient.

The portion of the hollow-core fiber 202 located inside the mount arrangement 204 may be an end portion of the fiber. A mounted hollow-core fiber arrangement 200 may comprise two separate mount arrangements 204. A first mount arrangement 204 may hold a first end portion of the fiber 202. A second mount arrangement 204 may hold a second end portion of the fiber 202. The first and second end portions may be opposite end portions of the same hollow-core fiber 202.

FIG. 11 depicts an example implementation of a mounted hollow-core fiber arrangement 200. A hollow-core fiber 202 may be located inside a receiving region 205 of a mount arrangement 204. The mount arrangement 204 may comprise a base 214 and a top lid 216. A force 218 may be applied to the top lid 216 of the mount arrangement 204. The force 218 may be translated by the mount arrangement into a force applied to the outer layer of fiber 202. Base 214 may comprise a groove. The space made available in the groove may form part of the receiving space 205. The groove may be a V-shaped groove, as illustrated in FIG. 11. In further implementations, the groove may have a polygonal shape, a curved shape, and/or an irregular shape.

The top lid 216 may also comprise a groove (not shown in FIG. 11). The groove may be located at the side of the top lid facing the base, so that when the top lid 216 is placed on top of the base 214 in its intended position, the groove in the base 214 may align with the groove in the top lid 216. When the grooves in the top lid 216 and the base 214 align, they may form a receiving region 205 for hollow-core fiber 202.

The receiving region may have a polygonal shape. The polygonal shape may for example be formed by a polygonal groove in the base, combined with the top lid. If the top lid comprises a groove, a polygonal receiving region may be formed by the aligned grooves of the top lid 216 and base 214. The polygonal form may be a regular polygonal form, that is to say, a polygon wherein the size of each angle between two neighboring sides is substantially the same. In FIG. 11, the groove in the base and the top lid may combine to form a regular triangle. FIGS. 12A and 12B depict two further example mount arrangements. The mount arrangements of FIG. 12 both comprise a top lid 216 with a groove, and a base 214 with a groove, wherein the grooves form substantially regular polygons. In the mount arrangement of FIG. 12A, the grooves combine to form a substantially regular hexagon. In the mount arrangement of FIG. 12B, the grooves combine to form a substantially regular pentagon. The regular polygons may receive the hollow-core fiber 202.

In a receiving region 205 as described above, the mounting contacts may be formed by points or regions on the boundaries of the receiving region. In case the receiving region has a polygonal shape, each side may comprise a mounting contact. In case the receiving region has a regular polygonal shape, a mounting contact may be positioned substantially in the center of each side of the polygon.

A mount arrangement 204 may be formed from a material able to be mechanically processed to form at least a portion of the receiving region 205. A mount arrangement may comprise a metal, for example aluminum, brass, or stainless steel. A mount arrangement 204 may comprise silica glass ($SiO_2$). For example, a groove may be etched into silica glass for forming a portion of the receiving region 205 of the mount arrangement 204. A mount arrangement 204 may comprise silicon (Si). The mount arrangement 204 may be formed from a plurality of materials. The hollow-core fiber 202 may have a length in a range of 10 s of centimeters to 10 s of meters. For example, a hollow-core fiber 202 may have a length between 10 cm to 100 m. The hollow-core fiber length may be between 10 cm and 1 m. The length of the hollow-core fiber 202 may be determined based on the application for which the mounted hollow-core fiber arrangement 200 is used. Specifically, the length may be determined by the spectral requirements of an application for which a hollow-core fiber 202 is intended to be used.

Figure 13:
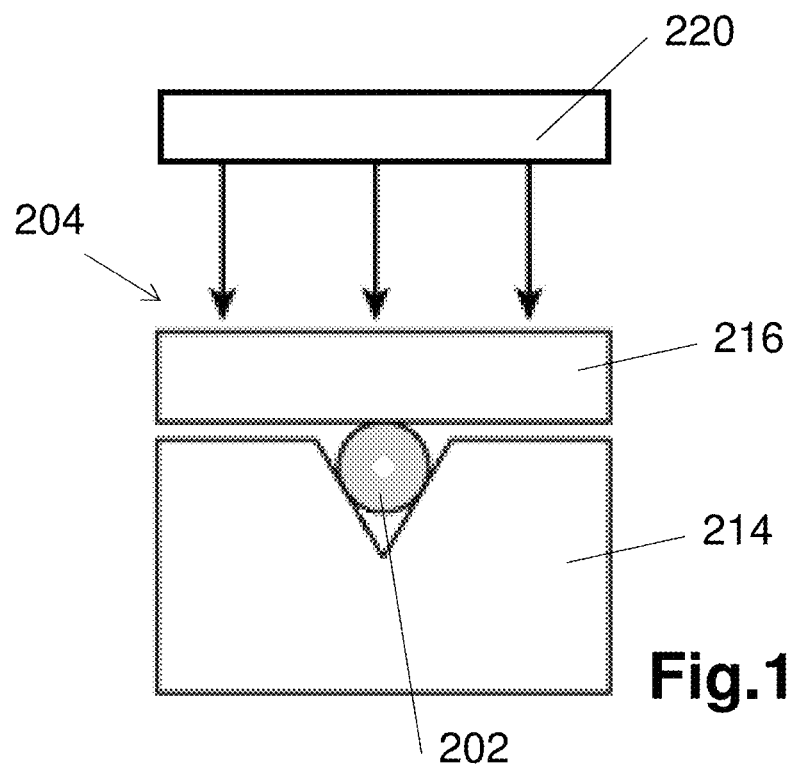
FIG. 13 depicts a mounted hollow-core fiber arrangement configured to apply an adjustable force to the mounted hollow-core fiber.

The mount arrangement may be configured to apply an adjustable force to the hollow-core fiber 202. FIG. 13 shows a mount arrangement 204 comprising a base 214 and a top lid 216, as described above. An adjustable force 220 may be applied by pressing the top lid 216 and the base 214 towards each other when they are aligned. The magnitude of the force applied to the mount arrangement 204 in order to push the top lid 216 and the base 214 together may be proportional to the strength of the force applied by the mounting contacts on the outer layer of the hollow-core fiber 202. The force applied to the mount arrangement may for example be in a range between 10 s of mN to a few N. An example range for a force applied to the mount arrangement 204 may be 10 mN to 10 N.

An advantage of having a mount arrangement 204 able to apply an adjustable force 220 to an outer layer of a mounted fiber, is that the force may be adjusted to improve optical performance of the hollow-core fiber 202. If the magnitude of the force applied to the outer layer of the hollow-core fiber 202 is too high, this may lead to increased stress-induced loss or mode scrambling. This in turn, may lead to a reduced quality output radiation beam. If the force applied to an outer layer of the hollow-core fiber 202 is too low, the fiber 202 may not be secured properly by the mount arrangement 204. If a fiber 202 is not securely mounted in a stable manner, this may lead to reduced coupling efficiency of radiation into and/or out of the fiber 202. Low clamping force may result in the fiber 202 slipping, which may in turn lead to loss of radiation coupling. It may be possible to determine and operate a mounted fiber arrangement 200 using a maximum tolerable force. Such a maximum tolerable force may be determined as the force with the highest magnitude that enables low-loss, high-modal purity transmission of radiation. The maximum tolerable force may be a balance between the risk of the fiber 202 slipping or moving in the mount arrangement 204 at too low force, and a degradation of optical performance at too high force. Low loss and high modal purity may both be determined as performing better than a predetermined threshold. A maximum tolerable force may depend on the system and/or application in which a fiber 202 is used. A maximum tolerable force may for example be determined based on one or more selected from: modal quality, average power spectral change, polarization, etc.

A force may be applied to the mount arrangement 204 by a structure comprising a spring-loaded screw. The spring in the structure may be adjusted to control the size of the force applied by the structure to the mount arrangement 204. The force applied by the spring-loaded screw may be adjusted manually, or may be set electronically. Electronic setting of a force may comprise setting a target magnitude of force, and having a control system adjust the spring-loaded screw until the target magnitude is achieved. In order to achieve a target force magnitude, the control system may for example comprise one or more sensors, or may be calibrated to associate a screw position with a corresponding force.

A force may be applied to the mount arrangement 204 by an electrical arrangement. The electrical arrangement may be configured to adjust the force applied by the mounting contacts MC to the outer layer of the hollow-core fiber 202. The force may be adjusted by adjusting an electric field. In an example implementation, an electrical arrangement may comprise a first plate located on a first side of the mount arrangement 204. The electrical arrangement may further comprise a second plate located on a second side of the mount arrangement 204. The first and second plates may be formed from a conducting material, so that when a field is applied between the first and second plates, the plates are drawn to each other. This may be achieved by opposite charge buildup on the opposing plates.

The second plate may be opposite the first plate, so that at least a portion of the mount arrangement 204 is located in between the first plate and the second plate. The portion located between the first and second plates may comprise the receiving region. The first side and the second side of the mount arrangement 204 may correspond to the sides of the base 214 and the top lid 216 of the mount arrangement 204 respectively, so that when the first and second plates are pulled towards each other, the base 214 and the top lid 216 are pressed together.

A force may be applied to the mount arrangement 204 by a magnetic arrangement. The magnetic arrangement may be configured to adjust the force applied by the mount arrangement 204 by applying a magnetic field. The magnetic arrangement may comprise a first magnet on a first side of the mount arrangement 204, and may comprise a second magnet on a second side of the mount arrangement. In some instances both of the magnets may be magnets with adjustable magnetic fields In other instances one of the magnets may have an adjustable magnetic field, while the other may be a magnet with a constant magnetic field. The magnets may for example be electromagnets, or permanent magnets. The magnetic arrangement may apply an adjustable force by applying opposite magnetic charges to the first and second sides, so that they are attracted towards each other. This may pull the first side of the mount arrangement towards the second side of the mount arrangement on which the magnets are located. The first and second sides may be on opposite sides of the mount arrangement. A portion of the mount arrangement comprising the receiving region may be located between the first and second sides. The first and second sides may be located on the base 214 and top lip 216 of the mount arrangement, respectively. When the magnets are drawn together, the base 214 may be pulled towards the top lid 216, applying a force on a hollow-core fiber 202 located in the receiving region 205. Adjusting the attractive force between the two magnets may adjust the force applied to the hollow-core fiber 202 outer layer.

The force applied by the base 214 on the top lid 216 may be equal and opposite to the force applied by the top lid 216 on the base 214 of the mount arrangement. The way in which the forces applied by the top lid is translated to a force applied by the mounting contacts depends on the shape and size of the receiving region. The shape of the receiving region may be designed in such a way that a preferred force application is achieved. For example, the length and/or angles of a polygon may be changed in order to change the proportion of the force applied to either the top lid 216 or base 214 that is translated to the mounting contact MC.

As described above, the force applied by a mount arrangement 204 to an outer layer of a hollow-core fiber 202 may be adjusted in order to reduce stress-induced loss or mode scrambling. The amount of loss and/or mode scrambling inside a hollow-core fiber 202 may be wavelength-dependent. This may be particularly relevant in implementations where the hollow-core fiber 202 is configured to operate over a broadband wavelength range. The range over which a hollow-core fiber is configured to function may be referred to as an operating wavelength range of the fiber. The operating wavelength range may comprise radiation in the infrared, visible, and/or ultraviolet portion of the electromagnetic spectrum. A broadband wavelength range may for example comprise wavelengths from 200 nm to 2000 nm, or from 400 nm to 1000 nm.

The force applied by the mounting contacts may be configured to be adjusted to optimize performance for at least a portion of the operating wavelength range of the hollow-core fiber 202. As described above, optimizing performance may refer to adjusting the force applied to the hollow-core fiber in order to reduce stress-induced loss and/or mode scrambling. The operating wavelength portion which the force adjustment may optimize, may be a narrowband wavelength range. The portion may comprise one or more discrete wavelengths, and/or one or more narrow wavelength ranges. The portion may for example be an output wavelength of interest to the application in which the hollow-core fiber 202 is used. In some examples the portion may comprise a wavelength of input radiation coupled into the hollow-core fiber 202.

A hollow-core fiber 202 may be used in a broadband radiation source, as described above. The hollow-core fiber 202 may for example be used to broaden input radiation to provide broadband output radiation. The broadband output radiation may comprise the input radiation. The input radiation may comprise a single wavelength, a plurality of discrete wavelengths, or a narrowband wavelength range. The output radiation may be supercontinuum radiation.

Figure 14:
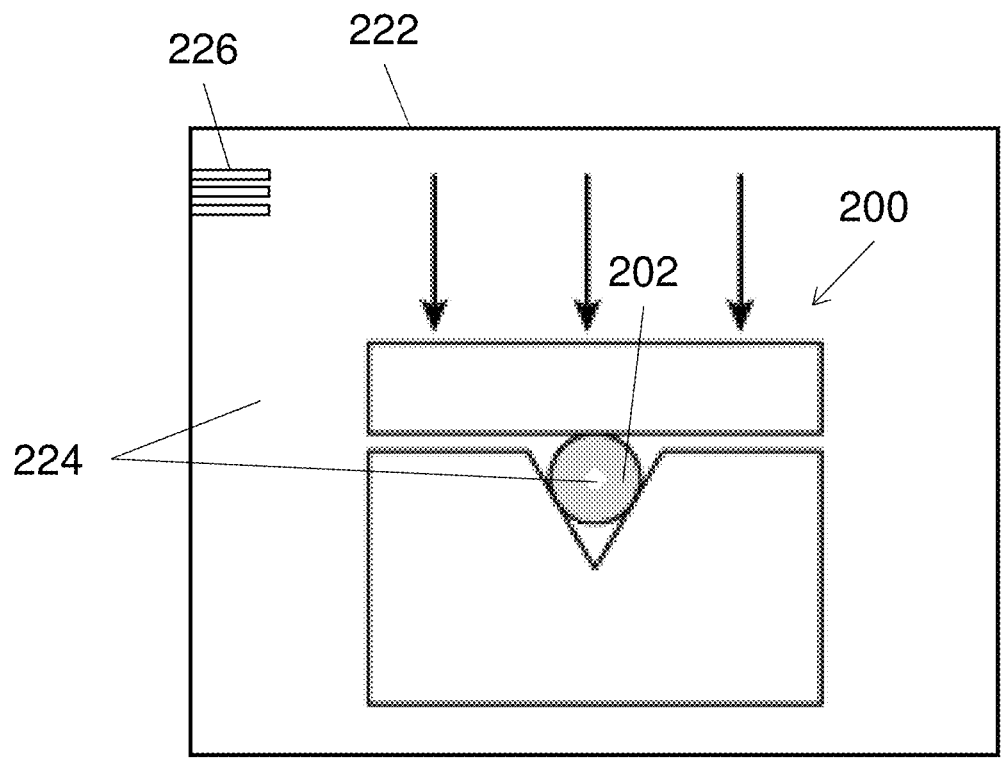
FIG. 14 depicts a schematic representation of a mounted hollow-core fiber arrangement inside a resealable reservoir.

FIG. 14 depicts a schematic overview of a mounted hollow-core fiber arrangement 200 located inside a reservoir 222. In order to broaden input radiation to obtain broadband output radiation, the hollow-core of fiber 202 may be filled with a gas mixture 224. In order to provide and control the gas mixture 224 inside the hollow-core of fiber 202, the fiber may be placed inside a resealable reservoir 222. The reservoir 222 may have a gas mixture control unit 226 to provide suitable gas conditions inside an interior of the reservoir for broadband radiation to be generated. A reservoir 222 may comprise the whole or one or more portions of the hollow-core fiber 202. The one or more portions of hollow-core fiber 202 may comprise at least the end portions of the hollow-core fiber 202, in which the gas mixture may enter and/or exit the hollow core of fiber 202.

Described herein is a radiation source apparatus for providing output radiation. The radiation source apparatus may receive input radiation from an input radiation source, The radiation source apparatus may comprise a mounted hollow-core fiber arrangement as described herein. The input radiation may be coupled into the hollow-core fiber 202, the radiation may propagate through the fiber, and output radiation may be coupled out of the hollow-core fiber 202. In order to enable coupling in to and out of the hollow-core fiber 202, one or more of the end portions of the hollow-core fiber may be mounted into a mount arrangement 204. The radiation source apparatus coupled to a source coupling input radiation into the hollow-core fiber 202 may form a radiation source.

The output radiation may be broadband radiation. In order to broaden input radiation to generate broadband output radiation, the mounted hollow-core fiber arrangement 200 may be placed inside a reservoir for providing a controllable gas mixture. The gas mixture provided inside the fiber may comprise a hydrogen component and an additional component. The additional component may be a noble gas. The additional component may comprise one or more of argon, krypton, neon, helium, and/or xenon. Alternatively or additionally, the additional component may comprise a molecular gas (e.g. $H_2$, $N_2$, $O_2$, $CH_4$, $SF_6$)

The hollow-core fiber 202 may be formed from a glass material. For example, a hollow-core fiber 202 may consist of or comprise any of the following: high purity silica ($SiO_2$) (for example the F300 material as marketed by Heraeus Holding GmbH of Germany); a soft glass such as lead-silicate glass (for example the $SF_6$ glass marketed by Schott AG of Germany); or other specialty glass such as chalcogenide glass or heavy metal fluoride glass (also referred to as ZBLAN glass). Other materials having properties suitable for fiber functionality (e.g. substantially transparent for frequencies in the operating range of the fiber) may be used.

A hollow-core fiber 202 may be mounted on both the input end portion and the output end portion of the hollow-core fiber 202. The force applied by the mount arrangement 204 may be adjusted to optimize performance for different wavelength(s) at the input end portion and the output end portion of the fiber. For example, the force applied by the mount arrangement 204 at the input end portion may be adjusted to optimize performance for one or more input radiation wavelengths. The force applied by the mount arrangement 204 at the output end portion may be adjusted to optimize performance for one or more wavelengths of the output radiation.

In order to determine the optimal force to be applied by a mount arrangement 204 to a mounted fiber portion, an adjustable force applied by the mount arrangement may be tuned. In order to tune the adjustable force to the specific requirements of a particular mounted hollow-core fiber arrangement 200, the tuning may be performed in use. In use may mean use as part of a radiation source. The output radiation coupled out from the hollow-core fiber 202 may be measured, and the quality of the radiation beam may be assessed in order to adjust the force and determine one or more optimal force settings.

A method for mounting a hollow-core fiber 202 in a mount arrangement 204 will now be described. A portion of the hollow-core fiber 202, for example an end portion, may be mounted into a receiving region 205 of the mount arrangement 204. The fiber 202 may be mounted on both end portions by two separate mount arrangements 204. The mounted hollow-core fiber arrangement may be placed in a resealable reservoir. The reservoir may be configured to provide a controllable gas mixture to enable spectral broadening of the input radiation inside the hollow-core fiber 202. The force applied by mounting contacts MC may be adjustable, and may be tuned to obtain optimized performance of the hollow-core fiber 202. Tuning the adjustable force may involve spectrally filtering broadband output radiation from the hollow-core fiber 202. The spectral filtering may select a narrow band of filtered output radiation wavelengths. The force applied by the mount arrangement, through the mounting contacts MC, may then be adjusted while the filtered output radiation beam is monitored.

Tuning of a force for a filtered portion of output radiation may be performed for a mount arrangement securing an output end portion of the hollow-core fiber 202. An input end portion of the hollow-core fiber 202 may be secured in a mount arrangement for which an adjustable force is tuned to optimize performance for the input wavelength radiation.

Tuning of the adjustable force while the hollow-core fiber 202 is in use inside a reservoir may be possible due to the possibility of remote tuning. The force may be adjusted inside the reservoir, for example through remote control and operation of an electrical arrangement, a magnetic arrangement, or mechanical force arrangement used for adjusting the force.

An adjustable force may be re-tunable while the mounted hollow-core fiber arrangement 200 is in use. For example, the fiber may form part of a broadband radiation source configure to operate in an apparatus using different portions of the broadband wavelength range sequentially. This may for example be achieved by sequentially filtering different portions of the output wavelength range. As the wavelength(s) of interest to an application change, the adjustable force may be re-tuned to optimize performance for those wavelength(s), as described above.

A mounted hollow-core fiber arrangement 200 as described herein may be used in a broadband radiation source. The broadband radiation source may be used in a metrology arrangement, for example in a metrology tool MT such as a metrology apparatus and/or an inspection apparatus as described above. The radiation source may be used in a lithographic apparatus LA. The radiation source may for example be used in a metrology arrangement inside a lithographic apparatus LA. One example of the metrology arrangement inside a lithographic apparatus LA is the alignment sensor shown in FIG. 5.

A metrology tool MT, such as a scatterometer, a topography measurement system, or a position measurement system mentioned above, may use radiation originating from a radiation source to perform a measurement. One or more properties of the radiation used by a metrology tool may affect the type and quality of measurements that may be performed. For some applications, it may be advantageous to use multiple radiation frequencies to measure a substrate, for example broadband radiation may be used. Multiple different frequencies may be able to propagate, irradiate, and scatter off a metrology target with no or minimal interference with other frequencies. Therefore different frequencies may for example be used to obtain more metrology data simultaneously. Different radiation frequencies may also be able to interrogate and discover different properties of a metrology target. Broadband radiation may be useful in metrology systems MT such a level sensor, an alignment mark measurement system, a scatterometry tool, or an inspection tool. A broadband radiation source may be a supercontinuum source.

High quality broadband radiation, for example supercontinuum radiation, may be difficult to generate. One method for generating broadband radiation may be to broaden high-power narrow band or single frequency input radiation, for example making use of non-linear, higher order effects. The input radiation (which may be produced using a laser) may be referred to as pump radiation. Alternatively, the input radiation may be referred to as seed radiation. To obtain high power radiation for broadening effects, radiation may be confined into a small area so that strongly localized high intensity radiation is achieved. In those areas, the radiation may interact with broadening structures and/or materials forming a non-linear medium so as to create broadband output radiation. In the high intensity radiation areas, different materials and/or structures may be used to enable and/or improve radiation broadening by providing a suitable non-linear medium.

In some implementations, the broadband output radiation is created in a photonic crystal fiber. (PCF). In several embodiments, such a photonic crystal fiber has microstructures around its fiber core assisting in confining radiation that travels through the fiber in the fiber core. The fiber core can be made of a solid material that has one or more non-linear properties and that is capable of generating broadband radiation when high intensity pump radiation is transmitted through the fiber core. Although it is feasible to generate broadband radiation in a solid core photonic crystal fiber, there may be a few disadvantages of using a solid material. For example, if UV radiation is generated in the solid core, this radiation might not be present in the output spectrum of the fiber because the radiation is absorbed by most solid material.

In some implementations, as discussed further below with reference to FIG. 16, methods and apparatuses for broadening input radiation may use a fiber for confining input radiation, and for broadening the input radiation to output broadband radiation. The fiber may be a hollow core fiber, and may comprise internal structures to achieve effective guiding and confinement of radiation in the fiber. The fiber may be a hollow core photonic crystal fiber (HC-PCF), which is particularly suitable for strong radiation confinement, predominantly inside the hollow core of the fiber, achieving high radiation intensities. The hollow core of the fiber may be filled with a gas acting as a broadening medium for broadening input radiation. Such a fiber and gas arrangement may be used to create a supercontinuum radiation source. Radiation input to the fiber may be electromagnetic radiation, for example radiation in one or more selected from: the infrared, visible, UV, and/or extreme UV spectra. The output radiation may consist of or comprise broadband radiation, which may be referred to herein as white light.

Some embodiments relate to a new design of such a broadband radiation source comprising an optical fiber. The optical fiber is a hollow-core, photonic crystal fiber (HC-PCF). In particular, the optical fiber may be a hollow-core, photonic crystal fiber of a type comprising anti-resonant structures for confinement of radiation. Such fibers comprising anti-resonant structures are known as anti-resonant fibers, tubular fibers, single-ring fibers, negative curvature fibers or inhibited coupling fibers. Various different designs of such fibers are known. Alternatively, the optical fiber may be a photonic bandgap fiber (HC-PBF, for example a Kagome fiber).

Figure 17A:
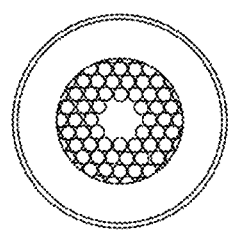
FIGS. 17A and 17B schematically depict transverse cross-sections of examples of hollow core photonic crystal fiber (HC-PCF) designs for supercontinuum generation.

A number of types of HC-PCFs can be engineered, each based on a different physical guidance mechanism. Two such HC-PCFs include: hollow-core photonic bandgap fibers (HC-PBFs) and hollow-core anti-resonant reflecting fibers (HC-ARFs). Detail on the design and manufacture of HC-PCFs can be found in U.S. Patent Application Publication No. US2004/015085 (for HC-PBFs) and PCT Patent Application Publication No. WO2017/032454A1 (for HC-ARFs), each of which is incorporated herein in its entirety by reference. FIG. 17A shows a Kagome fiber, comprising a Kagome lattice structure.

Figure 15:
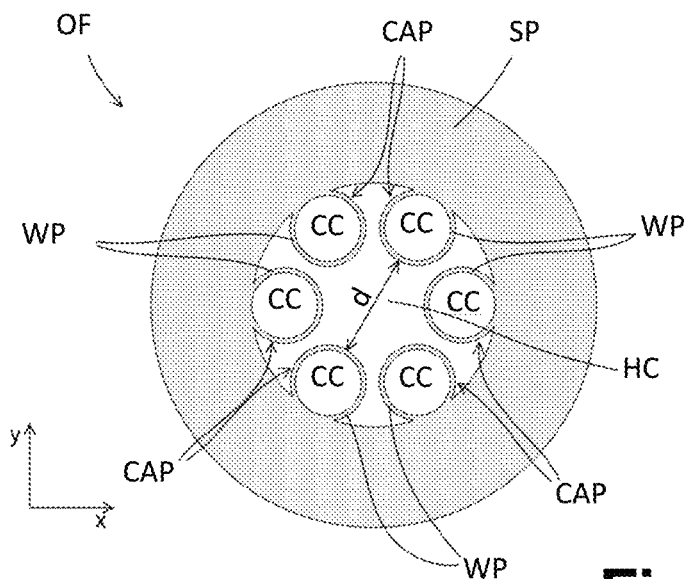
FIG. 15 is a schematic cross sectional view of a hollow core optical fiber, that may form part of a radiation source according to an embodiment, in a transverse plane (i.e. perpendicular to an axis of the optical fiber)

An example of an optical fiber for use in the radiation source is now described with reference to FIG. 15, which is a schematic cross sectional view of the optical fiber OF in a transverse plane. Further embodiments similar to the practical example of the fiber of FIG. 15 are disclosed in PCT Patent Application Publication No. WO2017/032454, which is incorporated herein in its entirety by reference.

The optical fiber OF comprises an elongate body, which is longer in one dimension compared to the other two dimensions of the fiber OF. This longer dimension may be referred to as an axial direction and may define an axis of the optical fiber OF. The two other dimensions define a plane which may be referred to as a transverse plane. FIG. 15 shows a cross-section of the optical fiber OF in this transverse plane (i.e. perpendicular to the axis), which is labelled as the x-y plane. The transverse cross-section of the optical fiber OF may be substantially constant along the fiber axis.

It will be appreciated that the optical fiber OF has some degree of flexibility and therefore the direction of the axis will not, in general, be uniform along the length of the optical fiber OF. The terms such as the optical axis, the transverse cross-section and the like will be understood to mean the local optical axis, the local transverse cross-section and so on. Furthermore, where components are described as being cylindrical or tubular these terms will be understood to encompass such shapes that may have been distorted as the optical fiber OF is flexed.

The optical fiber OF may have any length and it will be appreciated that the length of the optical fiber OF may be dependent on the application. The optical fiber OF may have a length between 1 cm and 10 m, for example, the optical fiber OF may have a length between 10 cm and 100 cm.

The optical fiber OF comprises: a hollow core HC; a cladding portion surrounding the hollow core HC; and a support portion SP surrounding and supporting the cladding portion. The optical fiber OF may be considered to comprise a body (comprising the cladding portion and the support portion SP) having a hollow core HC. The cladding portion comprises a plurality of anti-resonance elements for guiding radiation through the hollow core HC. In particular, the plurality of anti-resonance elements are arranged to confine radiation that propagates through the optical fiber OF predominantly inside the hollow core HC and to guide the radiation along the optical fiber OF. The hollow core HC of the optical fiber OF may be disposed substantially in a central region of the optical fiber OF, so that the axis of the optical fiber OF may also define an axis of the hollow core HC of the optical fiber OF.

The cladding portion comprises a plurality of anti-resonance elements for guiding radiation propagating through the optical fiber OF. In particular, in this embodiment, the cladding portion comprises a single ring of tubular capillaries CAP, e.g., six tubular capillaries CAP. Each of the tubular capillaries CAP acts as an anti-resonance element.

The capillaries CAP may also be referred to as tubes. The capillaries CAP may be circular in cross section, or may have another shape. In an embodiment, each capillary CAP comprises a generally cylindrical wall portion WP that at least partially defines the hollow core HC of the optical fiber OF and separates the hollow core HC from a capillary cavity CC. It will be appreciated that the wall portion WP may act as an anti-reflecting Fabry-Perot resonator for radiation that propagates through the hollow core HC (and which may be incident on the wall portion WP at a grazing incidence angle). The thickness of the wall portion WP may be suitable so as to ensure that reflection back into the hollow core HC is generally enhanced whereas transmission into the capillary cavity CC is generally suppressed. In some embodiments, the capillary wall portion WP may have a thickness between 0.01-10.0 µm.

It will be appreciated that, as used herein, the term cladding portion is intended to mean a portion of the optical fiber OF for guiding radiation propagating through the optical fiber OF (i.e. the capillaries CAP which confine the radiation within the hollow core HC). The radiation may be confined in the form of transverse modes, propagating along the fiber axis.

The support portion is generally tubular and supports the capillaries CAP of the cladding portion. The capillaries CAP are distributed evenly around an inner surface of the inner support portion SP. In an embodiment, the capillaries CAP may be described as being disposed in a generally hexagonal formation.

The capillaries CAP are arranged so that each capillary is not in contact with any of the other capillaries CAP. Each of the capillaries CAP is in contact with the inner support portion SP and spaced apart from adjacent capillaries CAP in the ring structure. Such an arrangement may be beneficial since it may increase a transmission bandwidth of the optical fiber OF (relative, for example, to an arrangement wherein the capillaries are in contact with each other). Alternatively, in some embodiments, each of the capillaries CAP may be in contact with adjacent capillaries CAP in the ring structure.

The capillaries CAP of the cladding portion are disposed in a ring structure around the hollow core HC. An inner surface of the ring structure of capillaries CAP at least partially defines the hollow core HC of the optical fiber OF. The cross-section dimension (e.g., diameter) d of the hollow core HC (which may be defined as the smallest dimension between opposed capillaries, indicated by arrow d) may be between 10 and 1000 µm. The dimension d of the hollow core HC may affect the mode field diameter, impact loss, dispersion, modal plurality, and/or non-linearity property of the hollow core optical fiber OF.

In this embodiment, the cladding portion comprises a single ring arrangement of capillaries CAP (which act as anti-resonance elements). Therefore, a line in any radial direction from a central portion of the hollow core HC to an exterior of the optical fiber OF passes through no more than one capillary CAP.

It will be appreciated that other embodiments may be provided with different arrangements of anti-resonance elements. These may include arrangements having multiple rings of anti-resonance elements and arrangements having nested anti-resonance elements. Furthermore, although the embodiment shown in FIG. 15 comprises a ring of six capillaries, in other embodiments, one or more rings comprising any number of anti-resonance elements (for example 4, 5, 6, 7, 8, 9, 10, 11 or 12 capillaries) may be provided in the cladding portion.

Figure 17B:
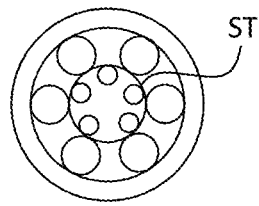

FIG. 17B shows a modified embodiment of the above discussed HC-PCF with a single ring of tubular capillaries. In the example of FIG. 17B there are two coaxial rings of tubular capillaries. For holding the inner and outer rings of tubular capillaries, a support tube ST may be included in the HC-PCF. The support tube may be made of silica.

The tubular capillaries of the examples of FIG. 15 and FIGS. 17A and 17B may have a circular cross-sectional shape. Other shapes are also possible for the tubular capillaries, like elliptical or polygonal cross-sections. Additionally, the solid material of the tubular capillaries of the examples of FIG. 15 and FIGS. 17A and 17B may comprise plastic material, like PMA, glass, like silica, or soft glass.

Figure 16:
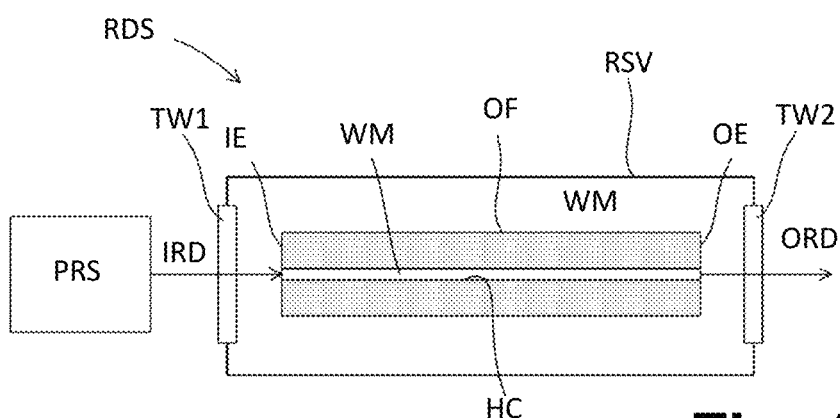
FIG. 16 depicts a schematic representation of a radiation source according to an embodiment for providing broadband output radiation.

FIG. 16 depicts a radiation source RDS for providing broadband output radiation. The radiation source RDS comprises a pulsed pump radiation source PRS or any other type of source that is capable of generating short pulses of a desired length and energy level; an optical fiber OF (for example of the type shown in FIG. 15) with a hollow core HC; and a working medium WM (for example a gas) disposed within the hollow core HC. Although in FIG. 16 the radiation source RDS comprises the optical fiber OF shown in FIG. 15, in alternative embodiments other types of hollow core optical fiber may be used.

The pulsed pump radiation source PRS is configured to provide input radiation IRD. The hollow core HC of the optical fiber OF is arranged to receive the input radiation IRD from the pulsed pump radiation source PRS, and broaden it to provide output radiation ORD. The working medium WM enables the broadening of the frequency range of the received input radiation IRD so as to provide broadband output radiation ORD.

The radiation source RDS further comprises a reservoir RSV. The optical fiber OF is disposed inside the reservoir RSV. The reservoir RSV may be referred to as a housing, a container or a gas cell. The reservoir RSV is configured to contain the working medium WM. The reservoir RSV may comprise one or more features for controlling, regulating, and/or monitoring the composition of the working medium WM (which may be a gas) inside the reservoir RSV. The reservoir RSV may comprise a first transparent window TW1. In use, the optical fiber OF is disposed inside the reservoir RSV such that the first transparent window TW1 is located proximate to an input end IE of the optical fiber OF. The first transparent window TW1 may form part of a wall of the reservoir RSV. The first transparent window TW1 may be transparent for at least the received one or more input radiation frequencies, so that received input radiation IRD (or at least a large portion thereof) may be coupled into the optical fiber OF located inside reservoir RSV. It will be appreciated that optics (not shown) may be provided for coupling the input radiation IRD into the optical fiber OF.

The reservoir RSV comprises a second transparent window TW2, forming part of a wall of the reservoir RSV. In use, when the optical fiber OF is disposed inside the reservoir RSV, the second transparent window TW2 is located proximate to an output end OE of the optical fiber OF. The second transparent window TW2 may be transparent for at least the frequencies of the broadband output radiation ORD of the apparatus 120.

In an embodiment, the two opposed ends of the optical fiber OF may be placed inside different reservoirs. The optical fiber OF may comprise a first end section configured to receive input radiation IRD, and a second end section configured to output broadband output radiation ORD. The first end section may be placed inside a first reservoir, comprising a working medium WM. The second end section may be placed inside a second reservoir, wherein the second reservoir may also comprise a working medium WM. The functioning of the reservoirs may be as described in relation to FIG. 16 above. The first reservoir may comprise a first transparent window, configured to be transparent for input radiation IRD. The second reservoir may comprise a second transparent window configured to be transparent for broadband output broadband radiation ORD. The first and second reservoirs may also comprise a sealable opening to permit the optical fiber OF to be placed partially inside and partially outside the reservoir, so that a gas can be sealed inside the reservoir. The optical fiber OF may further comprise a middle section not contained inside a reservoir. Such an arrangement using two separate gas reservoirs may be particularly convenient for embodiments wherein the optical fiber OF is relatively long (for example when the length is more than 1 m). It will be appreciated that for such arrangements which use two separate gas reservoirs, the two reservoirs (which may comprise one or more features for controlling, regulating, and/or monitoring the composition of a gas inside the two reservoirs) may be considered to provide an apparatus for providing the working medium WM within the hollow core HC of the optical fiber OF.

In this context a window may be transparent for a frequency if at least 50%, 75%, 85%, 90%, 95%, or 99% of incident radiation of that frequency on the window is transmitted through the window.

Both the first TW1 and the second TW2 transparent windows may form a tight seal within the walls of the reservoir RSV so that the working medium WM (which may be a gas) may be contained within the reservoir RSV. It will be appreciated that the working medium WM may be contained within the reservoir RSV at a pressure different to the ambient pressure of the reservoir RSV.

The working medium WM may comprise a noble gas such as argon, krypton, and/or xenon, a Raman active gas such as hydrogen, deuterium and/or nitrogen, or a gas mixture such as an argon/hydrogen mixture, a xenon/deuterium mixture, a krypton/nitrogen mixture, or a nitrogen/hydrogen mixture. Depending on the type of filling gas, the nonlinear optical processes can include modulational instability (MI), soliton self-compression, soliton fission, Kerr effect, Raman effect and/or dispersive wave generation, details of which are described in PCT Patent Application Publication No. WO2018/127266A1 and U.S. Pat. No. 9,160,137 (each of which is hereby incorporated in its entirety by reference). Since the dispersion of the filling gas can be tuned by varying the working medium WM pressure in the reservoir RSV (i.e. gas cell pressure), the generated broadband pulse dynamics and the associated spectral broadening characteristics can be adjusted so as to optimize frequency conversion.

In one implementation, the working medium WM may be disposed within the hollow core HC at least during receipt of input radiation IRD for producing broadband output radiation ORD. It will be appreciated that, while the optical fiber OF is not receiving input radiation IRD for producing broadband output radiation, the gas WM may be wholly or partially absent from the hollow core HC.

In order to achieve frequency broadening, high intensity radiation may be desirable. An advantage of having a hollow core optical fiber OF is that it may achieve high intensity radiation through strong spatial confinement of radiation propagating through the optical fiber OF, achieving high localized radiation intensities. The radiation intensity inside the optical fiber OF may be high, for example due to high received input radiation intensity and/or due to strong spatial confinement of the radiation inside the optical fiber OF. An advantage of hollow core optical fibers is that they can guide radiation having a broader wavelength range than solid-core fibers and, in particular, hollow core optical fibers can guide radiation in both the ultraviolet and infrared ranges.

An advantage of using a hollow core optical fiber OF may be that the majority of the radiation guided inside the optical fiber OF is confined to the hollow core HC. Therefore, the majority of the interaction of the radiation inside the optical fiber OF is with the working medium WM, which is provided inside the hollow core HC of the optical fiber OF. As a result, the broadening effects of the working medium WM on the radiation may be increased.

The received input radiation IRD may be electromagnetic radiation. The input radiation IRD may be received as pulsed radiation. For example, the input radiation IRD may comprise ultrafast pulses, for example, generated by a laser.

The input radiation IRD may be coherent radiation. The input radiation IRD may be collimated radiation, an advantage of which may be to facilitate and improve the efficiency of coupling the input radiation IRD into the optical fiber OF. The input radiation IRD may comprise a single frequency, or a narrow range of frequencies. The input radiation IRD may be generated by a laser. Similarly, the output radiation ORD may be collimated and/or may be coherent.

The broadband range of the output radiation ORD may be a continuous range, comprising a continuous range of radiation frequencies. The output radiation ORD may comprise supercontinuum radiation. Continuous radiation may be beneficial for use in a number of applications, for example in metrology applications. For example, the continuous range of frequencies may be used to interrogate a large number of properties. The continuous range of frequencies may for example be used to determine and/or eliminate a frequency dependency of a measured property. Supercontinuum output radiation ORD may comprise for example electromagnetic radiation over a wavelength range of 100 nm-4000 nm. The broadband output radiation ORD frequency range may be for example 400 nm-900 nm, 500 nm-900 nm, or 200 nm— 2000 nm. The supercontinuum output radiation ORD may comprise white light.

The input radiation IRD provided by the pulsed pump radiation source PRS may be pulsed. The input radiation IRD may comprise electromagnetic radiation of one or more frequencies selected from between 200 nm and 2 µm. The input radiation IRD may for example comprise electromagnetic radiation with a wavelength of 1.03 µm. The repetition rate of the pulsed radiation IRD may be of an order of magnitude of 1 kHz to 100 MHz. The pulse energies may have an order of magnitude of 0.1 µJ to 100 µJ, for example 1-10 µJ. A pulse duration for the input radiation IRD may be between 10 fs and 10 ps, for example 300 fs. The average power of input radiation IRD may be between 100 mW to several 100 W. The average power of input radiation IRD may for example be 20-50 W.

The pulsed pump radiation source PRS may be a laser. One or more of the spatio-temporal transmission characteristics of such a laser pulse, e.g. its spectral amplitude and/or phase, transmitted along the optical fiber OF can be varied and tuned through adjustment of one or more (pump) laser parameters, working medium WM variations, and/or optical fiber OF parameters. The one or more spatio-temporal transmission characteristics may include one or more selected from: output power, output mode profile, output temporal profile, width of the output temporal profile (or output pulse width), output spectral profile, and/or bandwidth of the output spectral profile (or output spectral bandwidth). The one or more pulse pump radiation source PRS parameters may include one or more selected from: pump wavelength, pump pulse energy, pump pulse width, and/or pump pulse repetition rate. The one or more optical fiber OF parameters may include one or more selected from: optical fiber length, size and/or shape of the hollow core, size and/or shape of the capillaries, and/or thickness of the walls of the capillaries surrounding the hollow core. The one or more working medium WM, e.g. filling gas, parameters may include one or more selected from: gas type, gas pressure and/or gas temperature.

The broadband output radiation ORD provided by the radiation source RDS may have an average output power of at least 1 W. The average output power may be at least 5 W. The average output power may be at least 10 W. The broadband output radiation ORD may be pulsed broadband output radiation ORD. The broadband output radiation ORD may have a power spectral density in the entire wavelength band of the output radiation of at least 0.01 mW/nm. The power spectral density in the entire wavelength band of the broadband output radiation may be at least 3 mW/nm.

Further embodiments are disclosed in the subsequent numbered clauses:

1. A mounted hollow-core fiber arrangement comprising:
   a hollow-core fiber having a microstructure; and
   a mount arrangement comprising a plurality of mounting contacts configured to apply a force to an outer layer of the hollow-core fiber, wherein:
   a portion of the hollow-core fiber is located in a receiving region of the mount arrangement,
   the plurality of mounting contacts are positioned around the receiving region, and
   the mounting contacts are distributed around the receiving region, the distribution of the mounting contacts corresponding to a distribution of features of the microstructure of the hollow-core fiber.

2. A mounted hollow-core fiber arrangement according to clause 1, wherein each of the plurality of mounting contacts is configured to apply a substantially equal force to the outer layer of the hollow-core fiber.

3. A mounted hollow-core fiber arrangement according to clause 1 or clause 2, wherein the positions of the plurality of mounting contacts are essentially equispaced around the receiving region.

4. A mounted hollow-core fiber arrangement according to any of clauses 1-3, wherein the distribution of features of the microstructure comprises a symmetry, and wherein the positions of the plurality of mounting contacts have a symmetry corresponding to the symmetry of the microstructure.

5. A mounted hollow-core fiber arrangement according to any of clauses 1-4, wherein the hollow-core fiber is a hollow-core photonic crystal fiber comprising a single ring structure with a plurality of capillaries surrounding the hollow core.

6. A mounted hollow-core fiber arrangement according to clause 5, wherein the capillaries distribution in the single ring structure has a number of rotational symmetries, and wherein the number of mounting contacts is an integer multiple of the number of rotational symmetries or the number of rotational symmetries is an integer multiple of the number of mounting contacts.

7. A mounted hollow-core fiber arrangement according to clause 5 or clause 6, wherein the number of mounting contacts is equal to the number of capillaries surrounding the hollow core.

8. A mounted hollow-core fiber arrangement according to any of clauses 1-7, wherein the portion of the hollow-core fiber mounted inside the receiving region of the mount arrangement is an end portion of the hollow-core fiber.

9. A mounted hollow-core fiber arrangement according to any of clauses 1-8, wherein the force applied by the mounting contacts is adjustable.

10. A mounted hollow-core fiber arrangement according to clause 9, wherein the mount arrangement comprises a spring-loaded screw configured to adjust the force applied by the mounting contacts.

11. A mounted hollow-core fiber arrangement according to clause 9, wherein the mount arrangement comprises an electrical arrangement configured to adjust the force applied by the mounting contacts by applying an electric field.

12. A mounted hollow-core fiber arrangement according to clause 11, wherein the electrical arrangement comprises a first plate on a first side of the mount arrangement, and a second plate on a second side of the mount arrangement, wherein the receiving region is located between the first side and the second side and the force is configured to be adjusted by adjusting an electric field applied between the first plate and the second plate.

13. A mounted hollow-core fiber arrangement according to clause 9, wherein the mount arrangement comprises a magnetic arrangement configured to adjust the force applied by the mounting contacts by applying a magnetic field.

14. A mounted hollow-core fiber arrangement according to clause 13, wherein the magnetic arrangement comprises a first magnet on a first side of the mount arrangement, and a second magnet of a second side of the mount arrangement, wherein the receiving region is located between the first side and the second side and the force is configured to be adjusted by adjusting the magnetic field applied between the first magnet and the second magnet.

15. A mounted hollow-core fiber arrangement according to any of clauses 9-14, wherein the force is configured to be adjusted to optimize performance of the hollow-core fiber for a predetermined narrow wavelength range.

16. A mounted hollow-core fiber arrangement according to clause 15, wherein the predetermined narrow wavelength range comprises a wavelength of a source for providing input radiation to be coupled into the hollow-core fiber.

17. A mounted hollow-core fiber arrangement according to clause 15, wherein the predetermined wavelength range comprises at least a portion of an operating wavelength range of the hollow-core fiber.

18. A mounted hollow-core fiber arrangement according to any of clauses 1-17, wherein the hollow-core fiber is configured to operate over a broadband wavelength range.

19. A mounted hollow-core fiber arrangement according to clause 18, wherein the broadband wavelength range comprises wavelengths from 200 nm to 2000 nm.

20. A mounted hollow-core fiber arrangement according to clause 18 or clause 19, wherein the broadband wavelength range comprises wavelengths from 400 nm to 1000 nm.

21. A mounted hollow-core fiber arrangement according to any of clauses 1-20, wherein the mount arrangement comprises a base with a groove forming part of the receiving region, and a top lid configured to cover the base.

22. A mounted hollow-core fiber arrangement according to clause 21, wherein the top lid comprises a groove for receiving the hollow-core fiber, and wherein the top lid groove aligns with the base groove to form the receiving region.

23. A mounted hollow-core fiber arrangement according to clause 21 or clause 22, wherein the base groove and the top lid are configured to form a polygonal form when the top lid covers the base.

24. A mounted hollow-core fiber arrangement according to clause 23, wherein each side of the polygonal form comprises a mounting contact.

25. A mounted hollow-core fiber arrangement according to clause 23 or clause 24, wherein the polygonal form is a regular polygonal form.

26. A mounted hollow-core fiber arrangement according to any of clauses 1-25, further comprising a reservoir configured to provide a resealable tight seal between an interior of the reservoir and an exterior of the reservoir, wherein the mounted hollow-core fiber is located inside the reservoir and the reservoir is configured to contain a controlled gas mixture.

27. A mounted hollow-core fiber arrangement according to any of clauses 1-26, comprising a second mount arrangement, wherein a second portion of the hollow-core fiber is located inside a receiving region of the second mount arrangement.

28. A mounted hollow-core fiber arrangement, comprising:
   a hollow-core fiber having a microstructure; and
   a mount arrangement comprising a plurality of mounting contacts configured to apply a force at a plurality of contact points to an outer layer of the hollow-core fiber, wherein:
   the hollow-core fiber is located in a receiving region of the mount arrangement;
   the plurality of mounting contacts are positioned uniformly around the receiving region of the mount arrangement; and
   the plurality of mounting contacts is configured to apply a substantially equal force at each of the plurality of contact points to the outer layer of the hollow-core fiber.

29. A mounted hollow-core fiber arrangement according to clause 28, wherein the hollow core fiber is a hollow core photonic crystal fiber comprising a single ring comprising a plurality of capillaries surrounding the hollow core.

30. A radiation source apparatus for providing output radiation comprising: a mounted hollow-core fiber arrangement according to clause 26 or clause 27, wherein the hollow-core fiber comprises an input end portion configured to receive input radiation, and an output end portion configured to provide output radiation and wherein the output end portion of the hollow-core fiber is located inside the receiving region of a first mount arrangement.

31. A radiation source apparatus according to clause 30, wherein the output radiation is broadband output radiation, and wherein the hollow-core fiber is configured to receive input radiation at the input end portion, broaden the wavelength range of the input radiation as the radiation propagates through the hollow-core fiber, and provide broadband output radiation at the output end portion of the hollow-core fiber.

32. A radiation source apparatus according to clause 30 or clause 31, wherein the input end portion of the hollow-core fiber is located in a receiving region of a second mount arrangement configured to receive the input end portion of the hollow-core fiber and wherein the second mount arrangement and the input end portion are located inside the interior of a reservoir.

33. A radiation source apparatus according to clause 32, wherein the first mount arrangement is configured to apply a first force to the output end portion and the second mount arrangement is configured to apply a second force to the input end portion, wherein the first force is optimized to reduce stress-induced loss or mode scrambling for a narrow wavelength range comprising in the output radiation, and wherein the second force is optimized to reduce stress-induced loss or mode scrambling for the input wavelength.

34. A method of mounting a hollow-core fiber into a mount arrangement, the method comprising:
providing a hollow-core fiber and a mount arrangement of any of clauses 9-27 when dependent on clause 9;
mounting a portion of the hollow-core fiber in the mount arrangement;
providing input radiation into the end section of the hollow-core fiber;
measuring radiation output by the hollow-core fiber for determining stress-induced loss or mode scrambling;
adjusting, while measuring radiation output by the fiber, the force applied by the plurality of mounting contacts of the mount arrangement so that stress-induced loss or mode scrambling inside the hollow-core fiber is reduced.

35. A metrology arrangement comprising a radiation source apparatus according to any of clauses 30 to 33.

36. A metrology apparatus comprising the metrology arrangement of clause 35.

37. An inspection apparatus comprising the metrology arrangement of clause 35.

38. A lithographic apparatus comprising the metrology arrangement of clause 35.

Although specific reference is made to "metrology apparatus/tool/system" or "inspection apparatus/tool/system", these terms may refer to the same or similar types of tools, apparatuses or systems. For example, an inspection or metrology apparatus that comprises an embodiment of the invention may be used to determine characteristics of structures on a substrate or on a wafer. For example, an inspection apparatus or metrology apparatus that comprises an embodiment of the invention may be used to detect defects of a substrate or defects of structures on a substrate or on a wafer. In such an embodiment, a characteristic of interest of the structure on the substrate may relate to defects in the structure, the absence of a specific part of the structure, or the presence of an unwanted structure on the substrate or on the wafer.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. An arrangement comprising:
a mount arrangement comprising a plurality of mounting contacts configured to apply a force at a plurality of contact points to an outer layer of a hollow-core fiber when supported by the mounting contacts;
a detector configured to measure radiation output by the hollow-core fiber for determining stress-induced loss or mode scrambling; and
a control system configured to adjust, based on the measured radiation, the force applied by the plurality of mounting contacts so that stress-induced loss or mode scrambling inside the hollow-core fiber is reduced.

2. The arrangement of claim 1, wherein the output radiation is broadband output radiation, and wherein the hollow-core fiber is configured to receive input radiation at an input end portion, broaden the wavelength range of the input radiation as the radiation propagates through the hollow-core fiber, and provide broadband output radiation at an output end portion of the hollow-core fiber.

3. The arrangement of claim 1, wherein the mounting contacts are distributed around a receiving region of the fiber, the distribution of the mounting contacts corresponding to a distribution of features of a microstructure of the fiber such that:
a number of the mounting contacts is an integer multiple of a number of rotational symmetries of the distribution of features of the microstructure or the number of rotational symmetries is an integer multiple of the number of mounting contacts, or
at least one of the contact points is positioned aligned with a position of one of the features, or
at least one of the contact points is positioned essentially equidistantly between two of the features.

4. The arrangement of claim 1, wherein at least one of:
the mount arrangement comprises a spring-loaded screw configured to adjust the force applied by the mounting contacts, or
the mount arrangement comprises an electrical arrangement configured to adjust the force applied by the mounting contacts by applying an electric field.

5. The arrangement of claim 1, wherein the mount arrangement is configured to apply either a first force to an output end portion or a second force to an input end portion and another same or different mount arrangement is configured to apply the other of the first or second force, wherein the first force is optimized to reduce stress-induced loss or mode scrambling for a narrow wavelength range comprising in output radiation, and wherein the second force is optimized to reduce stress-induced loss or mode scrambling for an input wavelength.

6. A radiation source apparatus for providing output radiation, the radiation source apparatus comprising:
a source of radiation; and
the arrangement of claim 1.

7. A metrology, inspection or lithographic apparatus comprising the radiation source apparatus of claim 6.

8. A method comprising:
measuring radiation output by a hollow-core fiber for determining stress-induced loss or mode scrambling; and
adjusting, based on the measured radiation output, a force applied by a plurality of mounting contacts configured to apply force at a plurality of contact points to an outer layer of the hollow-core fiber, so that stress-induced loss or mode scrambling inside the hollow-core fiber is reduced.

9. The method of claim 8, wherein the output radiation is broadband output radiation, and wherein the hollow-core fiber receives input radiation at an input end portion, broadens the wavelength range of the input radiation as the radiation propagates through the hollow-core fiber, and provides broadband output radiation at an output end portion of the hollow-core fiber.

10. The method of claim 8, wherein the mounting contacts are distributed around a receiving region of the fiber, the distribution of the mounting contacts corresponding to a distribution of features of a microstructure of the fiber such that:

a number of the mounting contacts is an integer multiple of a number of rotational symmetries of the distribution of features of the microstructure or the number of rotational symmetries is an integer multiple of the number of mounting contacts, or at least one of the contact points is positioned aligned with a position of one of the features, or at least one of the contact points is positioned essentially equidistantly between two of the features.

11. The method of claim 8, wherein at least one of:
the force is adjusted by a spring-loaded screw configured to adjust the force applied by the mounting contacts, or
the force is adjusted by an electrical arrangement configured to adjust the force applied by the mounting contacts by applying an electric field.

12. The method of claim 8, wherein the hollow-core fiber is a hollow-core photonic crystal fiber comprising a single ring structure with a plurality of capillaries surrounding the hollow core.

13. The method of claim 8, wherein the force is either a first force at an output end portion or a second force at an input end portion and further comprising applying the other of the first or second force, wherein the first force is optimized to reduce stress-induced loss or mode scrambling for a narrow wavelength range comprising in output radiation, and wherein the second force is optimized to reduce stress-induced loss or mode scrambling for an input wavelength.

14. An arrangement, comprising:
a hollow-core fiber; and
a mount arrangement comprising a plurality of mounting contacts configured to apply a force at a plurality of contact points to an outer layer of the hollow-core fiber, the plurality of mounting contacts configured to apply a substantially equal force at each of the plurality of contact points to the outer layer of the hollow-core fiber.

15. The arrangement according to claim 14, wherein the hollow core fiber is a hollow core photonic crystal fiber comprising a single ring comprising a plurality of capillaries surrounding the hollow core.

16. The arrangement according to claim 14, wherein at least one of:
the mount arrangement comprises a spring-loaded screw configured to adjust the force applied by the mounting contacts, or
the mount arrangement comprises an electrical arrangement configured to adjust the force applied by the mounting contacts by applying an electric field.

17. The arrangement according to claim 14, wherein the mount arrangement is configured to apply either a first force to an output end portion or a second force to an input end portion and another same or different mount arrangement is configured to apply the other of the first or second force, wherein the first force is optimized to reduce stress-induced loss or mode scrambling for a narrow wavelength range comprising in output radiation, and wherein the second force is optimized to reduce stress-induced loss or mode scrambling for an input wavelength.

18. The arrangement according to claim 14, wherein the mounting contacts are distributed around the fiber such that:

a number of the mounting contacts is an integer multiple of a number of rotational symmetries of a distribution of features of a microstructure of the fiber or the number of rotational symmetries is an integer multiple of the number of mounting contacts, or at least one of the contact points is positioned aligned with a position of at least one feature of a microstructure of the fiber, or at least one of the contact points is positioned essentially equidistantly between two of a plurality of features of a microstructure of the fiber.

19. A radiation source apparatus for providing output radiation, the radiation source apparatus comprising:
a source of radiation; and
the arrangement of claim 14.

20. A metrology, inspection or lithographic apparatus comprising the radiation source apparatus of claim 19.

* * * * *